United States Patent
Fackenthal et al.

(10) Patent No.: US 9,941,021 B2
(45) Date of Patent: Apr. 10, 2018

(54) PLATE DEFECT MITIGATION TECHNIQUES

(71) Applicant: Micron Technology, Inc., Boise, ID (US)

(72) Inventors: Richard E. Fackenthal, Carmichael, CA (US); Charles L. Ingalls, Meridian, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/184,795

(22) Filed: Jun. 16, 2016

(65) Prior Publication Data
US 2017/0365360 A1     Dec. 21, 2017

(51) Int. Cl.
*G11C 29/50* (2006.01)
*G11C 11/22* (2006.01)

(52) U.S. Cl.
CPC .......... *G11C 29/50* (2013.01); *G11C 11/221* (2013.01); *G11C 11/2273* (2013.01); *G11C 2029/5006* (2013.01)

(58) Field of Classification Search
CPC .................................................... G11C 29/50
USPC ............................................................ 365/145
See application file for complete search history.

(56) References Cited

U.S. PATENT DOCUMENTS

| | | | | | |
|---|---|---|---|---|---|
| 5,424,975 A | * | 6/1995 | Lowrey | ........... | G11C 11/22 365/145 |
| 5,668,753 A | * | 9/1997 | Koike | ........... | G11C 11/22 365/145 |
| 5,680,344 A | * | 10/1997 | Seyyedy | ........... | G11C 11/22 365/145 |
| 5,917,746 A | * | 6/1999 | Seyyedy | ........... | G11C 11/22 365/145 |
| 6,137,711 A | * | 10/2000 | Tan | ........... | G11C 11/22 365/145 |
| 6,151,242 A | * | 11/2000 | Takashima | ........... | G11C 11/22 365/145 |
| 6,566,698 B2 | * | 5/2003 | Nishihara | ........ | H01L 27/11502 257/295 |
| 6,667,896 B2 | * | 12/2003 | Rickes | ........... | G11C 11/22 365/145 |
| 9,715,918 B1 | * | 7/2017 | Kawamura | ........ | G11C 11/2273 |
| 9,715,919 B1 | * | 7/2017 | Ingalls | ........ | G11C 11/2273 |
| 2003/0076714 A1 | * | 4/2003 | Suzuki | ........... | G11C 7/24 365/200 |

(Continued)

*Primary Examiner* — Anthan Tran
*Assistant Examiner* — Mushfique Siddique
(74) *Attorney, Agent, or Firm* — Holland & Hart LLP

(57) ABSTRACT

Methods, systems, techniques, and devices for operating a ferroelectric memory cell or cells are described. Groups of cells may be operated in different ways depending, for example, on a relationship between cell plates of the group of cells. Cells may be selected in pairs in order to accommodate an electric current relationship, such as a short, between cells that make up the pair. Cells may be arranged in cell plate groups, and a pair of cells may include a first cell plate from one cell plate group and a second cell plate from the same cell plate group or from another, adjacent cell plate group. So a pair of cell plates may include cell plates from different cell plate groups. The first and second cell plates may be selected as a pair or a group based at least in part on the electric current relationship between the cell plates.

17 Claims, 10 Drawing Sheets

(56) References Cited

U.S. PATENT DOCUMENTS

| | | | |
|---|---|---|---|
| 2004/0076031 A1* | 4/2004 | Roehr | G11C 7/06 365/145 |
| 2005/0207201 A1* | 9/2005 | Madan | G11C 11/22 365/145 |
| 2007/0211510 A1* | 9/2007 | Madan | G11C 11/22 365/65 |
| 2009/0244951 A1* | 10/2009 | Murakuki | G11C 11/22 365/145 |
| 2010/0039851 A1* | 2/2010 | Morita | G11C 7/08 365/145 |
| 2012/0127776 A1* | 5/2012 | Kawashima | G11C 11/2273 365/145 |
| 2012/0307545 A1* | 12/2012 | McAdams | G11C 11/221 365/145 |
| 2015/0357020 A1* | 12/2015 | Manning | G11C 11/4091 365/189.08 |
| 2017/0263303 A1* | 9/2017 | Fackenthal | G11C 11/2273 |

* cited by examiner

PLATE DEFECT MITIGATION TECHNIQUES

BACKGROUND

The following relates generally to memory devices and more specifically to selection of and operations relating to cell plates.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory), may store data for extended periods of time even in the absence of an external power source. Volatile memory devices (e.g., DRAM), may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. In certain FeRAM designs (among other design types), vertically cut cell plates, among other components, may include one or more non-ideal or undesirable relationships or communications that renders the cell plates, other elements, and/or other components unusable and potentially require numerous redundant and expensive memory elements.

BRIEF DESCRIPTION OF THE DRAWINGS

Example embodiments of the present disclosure are described with reference to the following figures.

DETAILED DESCRIPTION

Figure 1:
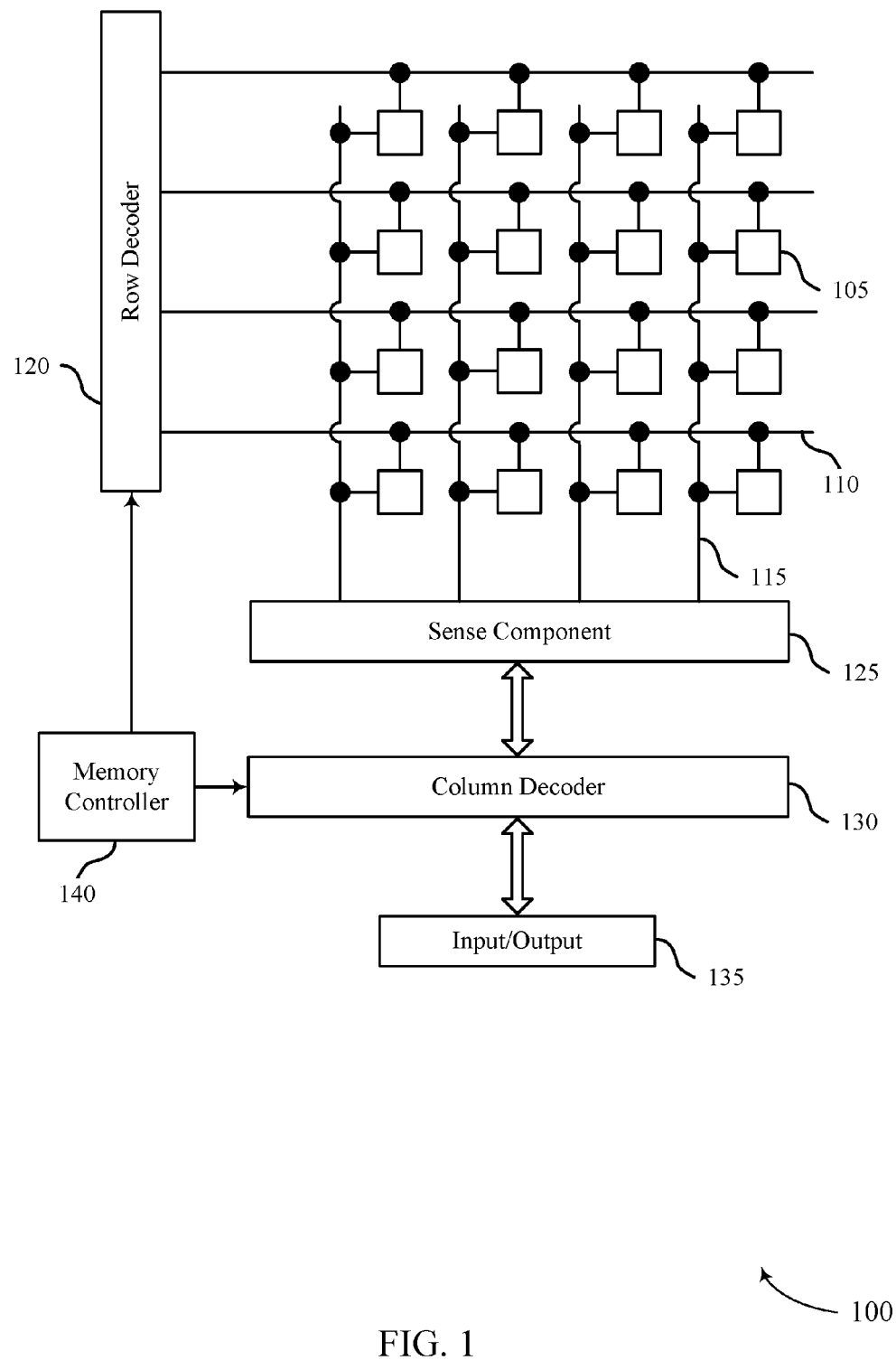
FIG. 1 illustrates an example memory array that supports selection of and operations based on one or more cell plates in accordance with various embodiments of the present disclosure.

In memory designs, when long traces or continuous portions of memory elements are printed, the risk of unintentional defects increases. These defects may create operational problems and may render parts of or whole memory arrays unusable. In some array designs, cell plates and other elements are close together, and there is a risk of unintentional current and other relationships between cell plates, including, but not limited to, adjacent cell plates. Based on manufacturing or other actions, cell plates may have a current relationship with or other defects relative to neighboring cell plates. Such relationships or defect may weaken or prohibit performance of one or more of the cell plates. Examples of such, relationships include shorts, parasitic fields or signals, and the like.

Some cell plates may include vertically-cut cell plates, among others, that may be common among a small number of digit lines (e.g., 4 to 16) and a relatively large number of word lines (e.g., 512 to 1024). The manner in which cell plates are formed during manufacturing may affect array performance. In some instances, because the distance between respective cell plates is relatively narrow (e.g., like the distances between digits lines, word lines) then an electric current relationship may exist between the cell plates. In some embodiments, a current relationship (e.g., a short) between cell plates of a group may render the group, the section, or some other memory elements inoperative. In some cases, the risk of shorting between cells may cause manufacturers to employ expensive wholesale or local redundancies, or both; and the risk of such deficiencies may promote other, relatively complex solutions, include more robust design parameters (e.g., increasing spacing between plates). These alternatives increase costs and decrease memory design functions and capabilities.

As described herein, memory arrays may be created and operated to mitigate risk of defects. By way of example, based on one or more current relationships between various cell plates (among other elements), two plates may be selected together to permit operation and populate one or more sensing components despite the current relationship (e.g., a short) existing between the plates that would otherwise render the plates or other elements (e.g., the section) inoperable. In some embodiments, this selection may be based at least in part on selecting two plates at the same time. In some embodiments, this selection may be based on selecting two plates concurrently. In some embodiments, this selection may be based on selecting one pair of plates that include an electrical current relationship. In some embodiments, this selection may be based on selecting one pair of plates that do not themselves include an electrical current relationship, but that spatially or otherwise relate to the plates having the electrical current relationship.

In some embodiments, the cell plates selected in one or more cell plate groups (e.g., groups of eight cell plates) may be selected based on a relative position to each other or other elements or components. For example, and as described further below, if a cell plate in the zero position (e.g., first position in a group) and a cell plate in the one position (e.g., second position in a group) have an electrical current relationship (e.g., a short exists between plates), then the cell plates in this group or in other groups may be selected or paired together using an "even-odd" relationship, which corresponds to the position-based zero-one relationship. As another example, if a cell plate in the three position (e.g., in the fourth position in the group) and the cell plate in the fourth position (e.g., the fifth position in the group) have an adverse current relationship (e.g., a predetermined current level exists), then the cell plates in this group and/or in other groups may all be selected or paired together using an "odd-even" relationship, which corresponds to the position-based three-four relationship.

In some embodiments, by selecting cell plates in corresponding pairs, the corresponding selection components (e.g., transistors) are arranged to enable a first set of cell plates (e.g., plates 0, 2, 4, and 6) to be connected to designated sense components (e.g., sense amps) using corresponding digit lines and a second set of cell plates (e.g., plates 1, 3, 5, and 7) to be connected to designated sense components (e.g., sense amps) using corresponding digit lines. In this way, when an adjacent pair or pairs of plates are selected, the designated sense components corresponding to the eight plates may each be correctly populated with data—despite one or more electrical current relationships between, for example, the plates, elements or components. As discussed further below, in some embodiments, this selection of plates and the corresponding correctly-populated sense components may be based on seven plates from a first cell plate group (e.g., plates 0 through 6, plates 1 through seven) and one plate from a second cell plate group (e.g., plate 7, plate 0), providing eight correctly populated sense components.

Embodiments of the disclosure introduced above are further described below in the context of a memory array, and in other contexts. Specific embodiments are then described for cell plates, including vertically cut cell plates and the selection of cell plates and related operations, among others. These and other embodiments of the disclosure are further illustrated by and described with reference to apparatus diagrams, system diagrams, and flowcharts that relate to selection of and operations based at least in part on one or more groups of cell plates.

In the present disclosure, a cell plates and a plate are used synonymously, unless the specific embodiment or embodiments indicates otherwise.

FIG. 1 illustrates an example memory array 100 that supports selection of and operations relating to one or more cell plates in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some embodiments, memory cell 105 is configured to store more than two logic states. Each state may produce a corresponding voltage across a memory cell 105 when the memory cell 105 is accessed. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties, and details and advantages of a ferroelectric memory cell 105 are discussed below.

Operations such as reading and writing may be performed on memory cells 105 by activating or selecting the appropriate word line 110 and digit line 115. Activating or selecting a word line 110 or a digit line 115 may include applying a voltage to the respective line. In some embodiments, a digit line 115 may be referred to as a bit line. Word lines 110 or digit lines 115, or both, may be referred to as access lines. Word lines 110 and digit lines 115 may be made of conductive materials. In some embodiments, word lines 110 and digit lines 115 are made of metals (e.g., copper, aluminum, gold, tungsten, etc.). Each row of memory cells 105 is connected to a single word line 110, and each column of memory cells 105 is connected to a single digit line 115.

By activating one word line 110 and one digit line 115, a single memory cell 105 may be accessed at their intersection. The intersection of a word line 110 and digit line 115 may be referred to as an address of a memory cell. In some embodiments, each digit line 115 may be connected to one or more sense components 125, which in some embodiments may include a sense amp, corresponding to each digit line 115. In some embodiments, one or more read or write operations may be based on or derived from one or more selections of cell plates. For example, selections of one or several cell plates may dictate a plate pair between two cell plates or a plate pairing for each set (e.g., a set of two cell plates) within one or more groups, sections, banks, dies, etc.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed. As discussed herein, in various embodiments, the address or location of one or more cells or cell plates may affect identifications, determinations, or selections related to cell plates, among other elements or components. In some embodiments, the address or the location of memory cells may affect a selection, such as a selection based on an absolute address or location or a relative address or location. In some embodiments, the address or the location of a memory cell and the existence of an electric current relationship may affect a selection of plate pairs, in cell plate group or across cell plate groups.

Upon accessing, a memory cell 105 may be read, or sensed, by sense component 125. When a memory cell 105 is read, the stored state may produce a corresponding signal across a capacitor of the cell, and thus at the digit line 115. For example, sense component 125 may compare a signal, e.g., a voltage, of the relevant digit line 115 to a reference signal (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written or initialized to a state, by similarly activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, among others, corrupting the stored logic state. So the logic state may be re-written after a sense operation. Additionally, activating a single word line 110 may result in the discharge of one or more memory cells in the row; thus, one or more memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high (e.g., tens of refresh operations per second for DRAM), which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells may have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate.

The memory controller 140 may control the operation (read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some embodiments, memory controller 140 may be related to or in electronic communication with a first cell plate and a second cell plate. A first digit line may be in electronic communication with the first cell plate and a first sense component (e.g., a sense amp) via a first selection component (e.g., a transistor). A second digit line may also be in electronic communication with the second cell plate and a second sense component (e.g., a sense amp) via a second selection component (e.g., a transistor). Based at least in part on the electronic communication, the controller may be operable to initiate or perform one or more operations relating to selecting one or more cell plate pairs. In some embodiments, the memory controller 140 may be operable to determine an electric current relationship relating to one or more cell plates. Based at least in part on this determining or identifying, the memory controller 140 may initiate (e.g., send an instruction or a signal to, or control another element or component to operate to) and operate to select the first cell plate and the second cell plate using the first selection component or the second selection component. This selection may, in some embodiments, include an electronic communication from the controller to the one or more selection components.

Figure 2:
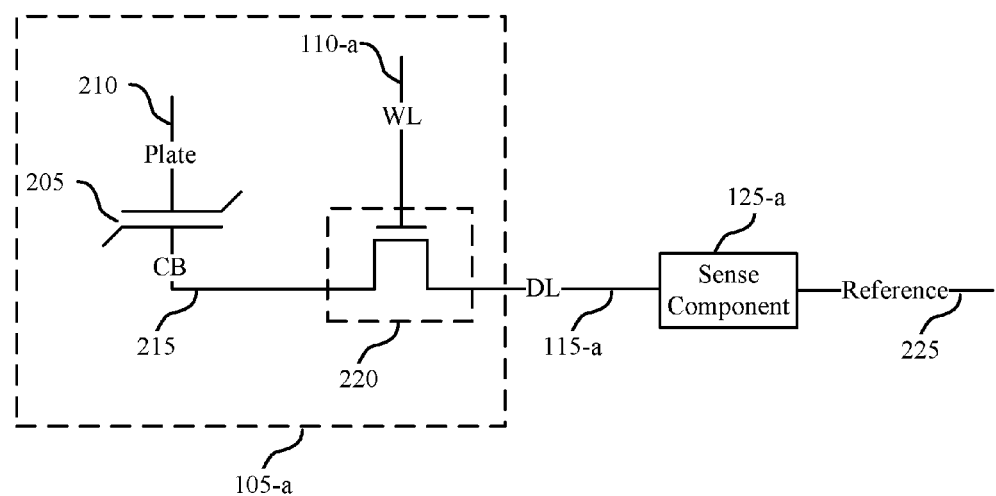
FIG. 2 illustrates an example circuit of a memory cell that supports selection of and operations relating to one or more cell plates in accordance with various embodiments of the present disclosure.

FIG. 2 illustrates an example circuit 200 that supports selection of and operations relating to one or more cell plates in accordance with various embodiments of the present disclosure. Circuit 200 may include a ferroelectric memory cell 105-a, a word line 110-a, a digit line 115-a, and a sense component 125-a, which may be embodiments of a memory cell 105, a word line 110, a digit line 115, and a sense component 125, respectively, as described with reference to FIG. 1 and/or others. Circuit 200 includes a logic storage component, such as capacitor 205, which may include conductive terminals, including plate 210 and cell bottom 215. These terminals may be separated by an insulating ferroelectric material. As described in the present disclosure, various states may be stored by charging or discharging capacitor 205.

The stored state of capacitor 205 may be read or sensed by operating various elements represented in circuit 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated to select the ferroelectric memory cell 105-*a*. In other words, ferroelectric memory cell 105-*a* may be selected using selection component 220 that is in electronic communication with ferroelectric capacitor 205, where ferroelectric memory cell 105-*a* includes selection component 220 and ferroelectric capacitor 205. In some embodiments, selection component 220 may be or include a transistor and its operation may be controlled by applying a voltage to a transistor gate, where the voltage has a magnitude greater than the threshold magnitude of the transistor. Word line 110-*a* may activate selection component 220; for example, a voltage applied to word line 110-*a* may be applied to the transistor gate, connecting capacitor 205 with digit line 115-*a*.

In the example depicted in FIG. 2, capacitor 205 is a ferroelectric capacitor. Due to the ferroelectric material between the plates of capacitor 205, and as discussed in more detail below, capacitor 205 may not discharge upon connection to digit line 115-*a*. Instead, plate 210 may be biased by an external voltage, resulting in a change in the stored charge on capacitor 205. The change in stored charge corresponds to and/or depends on an initial logic state of capacitor 205. A voltage applied to capacitor 205 changes the charge of capacitor 205. The change in charge may be compared to a reference 225 (e.g., a reference voltage) by sense component 125-*a* in order to determine the stored logic state in memory cell 105-*a*.

The specific sensing scheme or process may take many forms. In one example, digit line 115-*a* may have an intrinsic capacitance and develop a non-zero voltage as capacitor 205 charges or discharges in response to the voltage applied to plate 210. The intrinsic capacitance may depend on physical characteristics, including the dimensions, of digit line 115-*a*, among others. Digit line 115-*a* may connect many memory cells 105 so digit line 115-*a* may have a length that results in a non-negligible capacitance (e.g., on the order of pF or fF). The subsequent voltage of digit line 115-*a* may depend on the initial logic state of capacitor 205, and sense component 125-*a* may compare this voltage to a reference voltage, which may include a reference voltage generated by other memory cells 105. For example, a voltage may be applied to plate 210 and a voltage at capacitor bottom 215 may change in relation to the stored charge. The voltage at capacitor bottom 215 may be compared with a reference voltage at sense component 125-*a*, and a comparison to the reference voltage may indicate a change in the charge of capacitor 205 resulting from the applied voltage and thus indicate a logic state stored in memory cell 105-*a*. The relationship between charge and voltage in capacitor 205 is described in further detail with reference to FIG. 3, among others.

Other sensing processes may be used. For example, two or more sense components 125-*a* may each sense the voltage or other characteristics at two or more digit lines 115-*a* that each correspond to one or more plates 210. In some embodiments, when the two or more plates 210 include adjacent plates 210, these plates 210 may be selected together and the value sensed by each sense component 125-*a* (e.g., a sense amp) may be correctly read or monitored so that the eight sense components 125-*a* corresponding to a plate group (or parts of two plates groups) are each correctly populated with data. In some embodiments, each of four sense components 125-*a* is populated based on one of four digit lines 115-*a* corresponding to a first cell plate 210 and each of four sense amps is populated based on one of four digit lines corresponding to a second cell plate 210. By using the selection and shifting techniques and methods of the present disclosure and selecting two cell plates 210 together the eight sense components (e.g., sense amps) may be correctly populated regardless of any electric current relationship relating to or between two cell plates 210 and/or one or more other defects or adverse conditions relating to the two cell plates 210 or other elements or components.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 using plate line 210 and controlling the voltage of cell bottom 215 using digit line 115-*a*. To write a logic "0," cell plate 230 may be taken high, that is, a positive voltage may be applied to plate line 210, and cell bottom 215 may be taken low—e.g., virtually grounded using digit line 115-*a*. The opposite process is performed to write a logic "1", i.e., cell plate 230 may be taken low and cell bottom 215 may be taken high. Read and write operations of capacitor 205 may account for the non-linear properties associated with a ferroelectric device.

Figure 3:
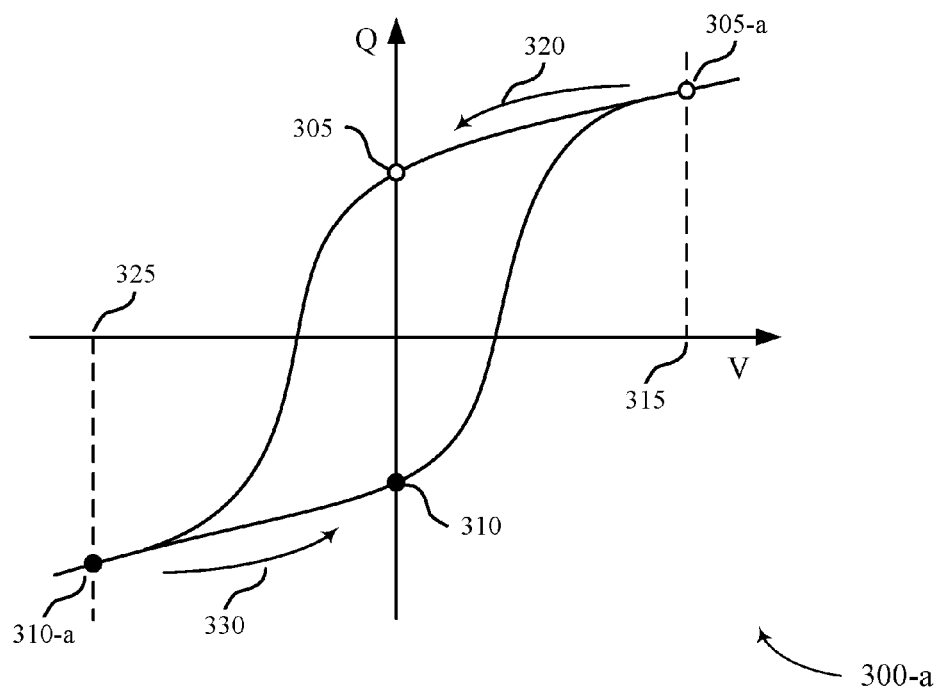
FIG. 3 illustrates example hysteresis curves for a ferroelectric memory cell that supports selection of and operations relating to one or more cell plates in accordance with various embodiments of the present disclosure.
Figure 3:
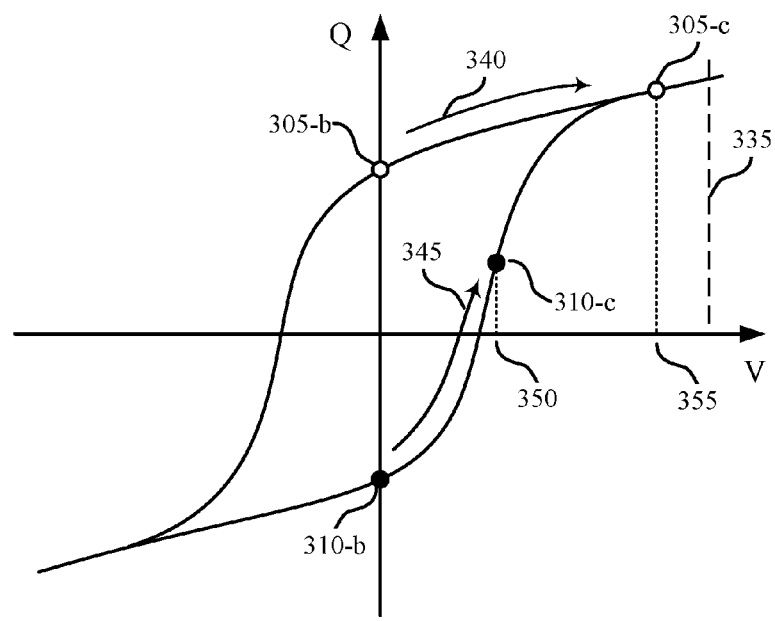

FIG. 3 illustrates example hysteresis curves 300 for a ferroelectric memory cell that supports selection of and operations relating to one or more cell plates in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge may be stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some architectures.

Hysteresis curves 300 may be understood from the perspective of a single terminal of a capacitor. By way of example, if the ferroelectric material has a negative polarization, positive charge may accumulate at the terminal. Likewise, if the ferroelectric material has a positive polarization, negative charge may accumulate at the terminal. Additionally, the voltages in hysteresis curves 300 represent a voltage difference across the capacitor and are directional. For example, a positive voltage may be applied by applying a positive voltage to the terminal in question and maintaining the second terminal at a reference voltage, the may be ground (e.g., approximately zero volts (0V)). A negative voltage may be applied by maintaining the terminal in question at ground and applying a positive voltage to the second terminal, i.e., positive voltages may be applied to negatively polarize the terminal in question. Similarly, two positive voltages, two negative voltages, or a combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some embodiments, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing positive voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depends on whether charge state 305-b or 310-b was initially stored. For example, hysteresis curve 300-b illustrates two possible stored charge states 305-b and 310-b. Net voltage 335 may be applied across the capacitor. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing operation and circuitry.

In some embodiments, the charge sensed during a read operation may depend on the intrinsic capacitance of the digit line of a memory cell. For example, if a ferroelectric capacitor of the memory cell is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis, i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. For example, the reference voltage may be an average of the quantities (voltage 335-voltage 350) and (voltage 335-355). Upon comparison, the sensed digit line voltage may be determined to be higher or lower than the reference voltage. A value of the ferroelectric cell (i.e., a logic 0 or 1) may then be determined based on the comparison.

As discussed above, reading a DRAM memory cell may degrade or destroy the stored logic. A ferroelectric memory cell, however, may maintain the initial logic state after a read operation. For example, if charge state 305-b is stored and the read operation performed, the charge state may return to initial charge state 305-b after voltage 335 is removed, for example, by following path 340 in the opposite direction.

Figure 4:
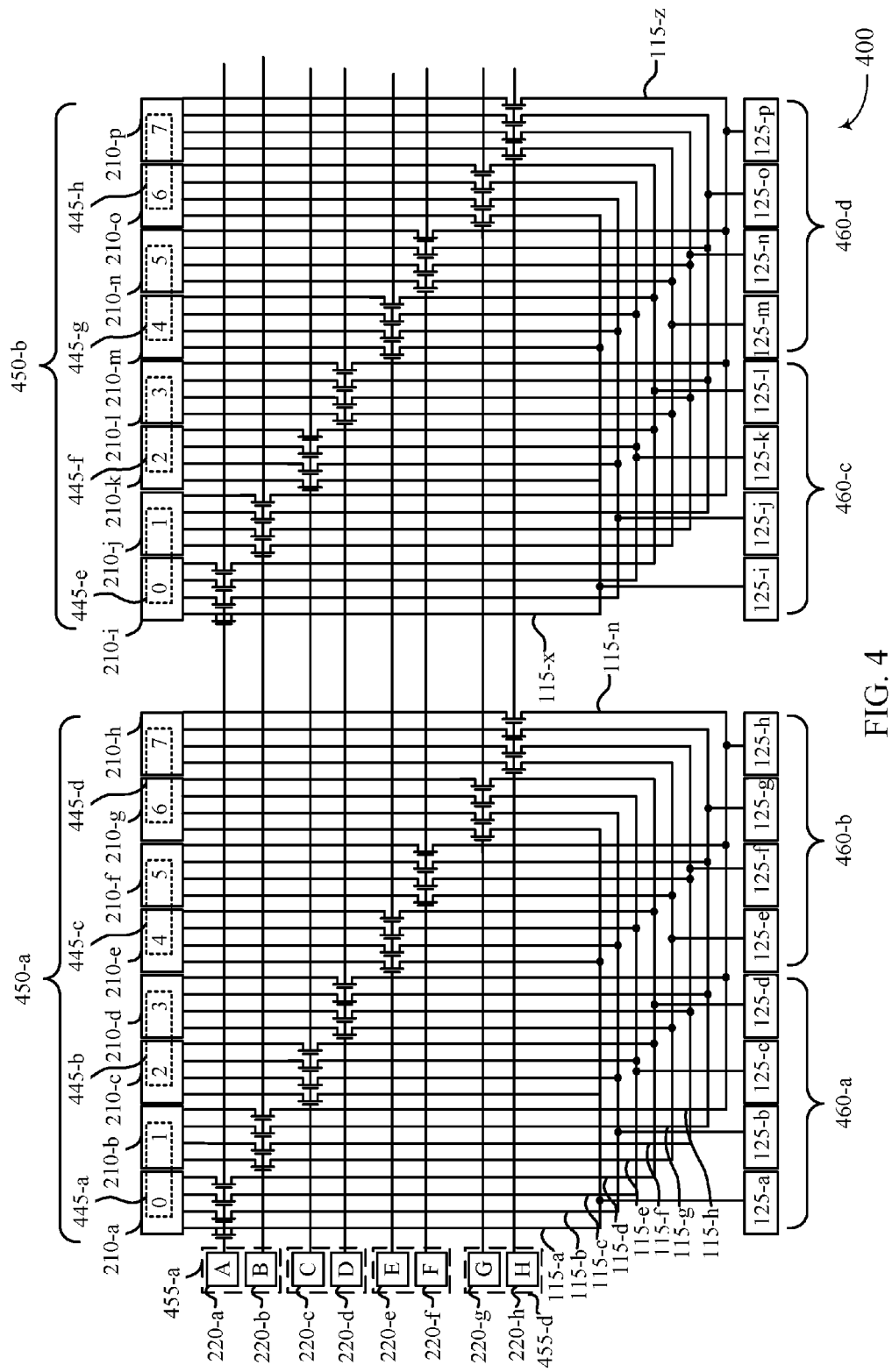
FIG. 4 illustrates an example of a memory array and other components that support selection of and operations relating to one or more cell plates in accordance with various embodiments of the present disclosure.

FIG. 4 illustrates an example array 400 that supports selection of and operations relating to one or more cell plates in accordance with various embodiments of the present disclosure. Array 400 may include a ferroelectric memory cell, one or more word lines, digit lines (e.g., 115-a to 115-h, 115-n, 1115-x to 115-z, etc.), sense components (e.g., 125-a to 125-p, plates (e.g., 210-a to 210-p), and/or selection components (e.g., 220-a to 220-h), which may be examples of a memory cell 105, word line 110, digit line 115, sense component 125, plates 210, and selection component 220, respectively, as described with reference to FIG. 1, 2, or others. Array 400 may include a logic storage component, such as a capacitor (e.g., capacitor 205 discussed with reference to FIG. 2), which may include conductive terminals, including plate 210 and cell bottom 215 (also discussed with reference to FIG. 2). These terminals may be separated by an insulating ferroelectric material. As described above, various states may be stored by charging or discharging capacitor 205.

In accordance with various embodiments of the present disclosure, additional elements are contemplated, although each may not be explicitly labeled or shown. For example, in addition to selection component pair 455-a (relating to selection component 220-a and selection component 220-b) and selection component pair 455-d (relating to selection component 220-g and selection component 220-h), array 400 may include additional components or selection component pairs, or both, among other features. For example, array 400 may include selection component pair 455-b (relating to selection component 220-c and selection component 220-d) and selection component pair 455-c (relating to selection component 220-e and selection component 220-f). As another example, array 400 may include four digit lines (or another number of digit lines per plate (e.g., plate 210-a) that may be distinct and be separately identified, while only some of the digit lines shown are explicitly labeled (e.g., 115-a to 115-h, 115-n, and 115-x to 115-z, etc.).

Array 400 may also include plate pairs 445-a to 445-h, that relate to two or more examples of plates 210 (e.g., 210-a and 210-b). In some embodiments, plate pairs 445-a to 445-h may fall within one or more plate groups 450, such as plate group 450-a and 450-b, as shown in FIG. 4. Array 400 may also include selection component pairs 455-a to 455-d, that relate two selection components 220 (e.g., 220-a and 220-b). Array 400 may also include sense component groups (e.g., 460-a to 460-d), that relate one or more sense components 125 (e.g., 125-a to 125-d).

In some embodiments, array 400 includes eight sense components 125 for each plate group (e.g., plate group 450-a), with each sense component 125 in electronic communication with one or more digit lines (e.g., digit line 115-a, digit line 115-b) relating to one or more plates (e.g., plate 210-a, plate 210-b). In other embodiments, array 400 includes more than or fewer than eight sense components 125 for each plate group (e.g., plate group 450-a, plate group 450-b).

In some embodiments, array 400 and the associated techniques may be used for vertical cut plates (e.g., plate 210-a, plate 210-b) that may be used in FeRAM or other RAM designs (e.g., resistive RAM such as CBRAM). With various plates 210, often a current relationship exists between two plates or between multiple sets of plates. In some embodiments, this current relationship is based on two adjacent plates being coupled or otherwise having a path between that supports unintended communication, inducement, interference, or electron flow. The relationship between such plates may be referred to as an electric current relationship or a performance-based relationship, or the like, because there may be a flow of or effects on current between the two plates. This electric current relationship may, in some embodiments, include a short circuit existing between the two plates, among other things.

In some embodiments, based on identifying an electric current relationship between two plates (e.g., plate 210-*a* and 210-*b*), two or more plates 210 may be selected. This selection may include grouping two cell plates into a plate pair (e.g., plate pair 445-*a*) to facilitate reading, writing, or other operations, despite the electric current relationship between the two plates.

As one example, plate 210-*a* (in the "0" position) and plate 210-*b* (in the "1" position) may have an electric current relationship, which may be understood as an "even-odd" electric current relationship (based on the "0" and "1" positions of the plates 210). In some embodiments, this electric current relationship may be identified or determined based on biasing one of the plates or some other method or technique. For example, by biasing plate 210-*a* for a read operation, and knowing that biasing plate 210-*a* should cause the plate 210-*b* to have a current or other value below a threshold, it may be determined that an electric current relationship exists between plate 210-*a* and plate 210-*b* if the current (or other value) of plate 210-*b* is above the threshold. In some embodiments, this identifying, determining, or selecting may be performed during testing, while in other embodiments, this identifying, determining, or selecting may be performed on a finished product that has a capability or one or more structural features to enable a selection of cell plates based on an electric current relationship.

In some embodiments, based on identifying this or other electric current relationships, plate pair 445-*a* may be selected. This selecting of plates 210-*a* and 210-*b* may be accompanied by selecting a selection component pair 455-*a* that selects selection component 220-*a* and 220-*b*, as an example. By selecting plates 210-*a* and 210-*b* and selection components 220-*a* and 220-*b* (and corresponding word and digit lines (e.g., 115-*a* to 115-*h*)), each of sense components 125-*a* to 125-*h* may be appropriately populated with data, and sense component groups 460-*a* and 460-*b* may be fully populated to allow for read, write, or other operations.

In some embodiments, based on identifying an electric current relationship between plates 210-*a* and 210-*b* (as one example) within a first plate group 450-*a*, one or more other plate pairs (e.g., 445-*b*, 455-*c*) may be selected. For example, selecting plates 210-*g* and 210-*h* may be accompanied by selecting a selection component pair 455-*d* that selects selection components 220-*g* and 220-*h*. By selecting plates 210-*g* and 210-*h* and selection components 220-*g* and 220-*h* (and corresponding word and digit lines, each of sensing components 125 corresponding to the digit lines 115 may be appropriately populated with data and the sense component group 460 may be fully populated to allow for read, write, or other operations.

In some embodiments, one set of selection components 220 (among other components or elements) may be in electronic communication with or relate to multiple plate groups 450, plates 210, or other sets of memory components. For example, one set of selection components 220 (e.g., selection components 220-*a* to 220-*h*) may facilitate or perform selection of one or more plates 210 related to one or more plate groups 450 (e.g., plate group 450-*a*, plate group 450-*b*).

Additionally or alternatively, one or more other sets of selection components 220 (among other components or elements) may be in electronic communication with or relate to multiple plate groups 450, plates 210, and/or other sets of memory components. As an example, one set of selection components 220 (e.g., selection components 220-*a* to 220-*h*) may facilitate or perform selection of one or more plates related to one plate group 450 (e.g., plate group 450-*a*) and another set of selection components 220 (e.g., selection components 220-*i* to 220-*p*) may facilitate and/or perform selection of one or more plates 210 related to one plate group 450 (e.g., plate group 450-*b*).

In some embodiments, the array 400 may include plate pairs (e.g., 445-*a*, 445-*b*, 445-*c*, 445-*d*), that fall within the same plate group 450-*a* and may be selected based on an electric current relationship between plates 210 within the plate group 450-*a*.

In some embodiments, the array 400 may include plate pairs 445 (e.g., 445-*e*, 445-*f*, 445-*g*, 445-*h*), that fall within another plate group 450-*b* and may be selected based on an electric current relationship between plates within another plate group 450, such as plate group 450-*a*. This selection may be based on multiple factors, including the granularity of the selection, the determination, the identification, or the array, as discussed below.

For example, in some embodiments, an element of array 400 (or some related component or element discussed in other figures, such as memory controller 140) may be configured to select the plate groups 450 shown in FIG. 4 based on an electric current relationship between plates 210-*a* and 210-*b*. Based on determining (via a read or write operation or monitoring performance of one or more plates) or identifying the electric current relationship, one or more elements (e.g., a fuse) associated with groups of plate groups may initiate or be related to the selection of the plate pairs (e.g., 445-*a* to 445-*h*, etc.). In some embodiments, the number of elements or components facilitating selection of the plates/or plate pairs may be minimal and may be based on projected or known design parameters (including, for example, one or more known electric current relationships between plates).

For example, in some embodiments, a die may include one element facilitating selection of the plates (e.g., one fuse) to provide the desired selection and pairing capabilities relating to various techniques or methods. In such cases, when the one fuse is triggered, then one plate pair, multiple plate pairs, or every plate on the die may be grouped into a plate pair based on one or more identified or determined electric current relationships (e.g., whether some are even-odd or whether some are odd-even). Based on the fuse being triggered, every plate may be selected to be paired in an odd-even (e.g., barrel shift) relationship to mitigate the effects of the one or more (identified, determined, and/or unknown) electric current relationships. This barrel shift relationship\or selection, allows for groupings relating to one plate from a first plate group and one plate from a second plate group, among other examples. Barrel shifting (or cyclic shifting) as applied herein is discussed in further detail with reference to FIG. 5, among others.

In some embodiments, the selection may be more granular and may apply only to the plates in the electric current relationship, those in the same plate group, in adjacent plate groups, and/or some other structure of a larger memory sample (e.g., one or more dies, banks, subsets of one or more banks, half banks, sections, half sections, and/or subsets of one or more banks, groups, sections, etc.). For example, in some embodiments, each section may include one set of fuses (and/or some other element and/or component) per section (with hundreds of sections on a memory chip), which would allow for many more defects and/or electric current relationships on a memory chip and which would also allow for more granular adjustment and/or selection by section (and/or a bank that includes multiple sections) based on the designed granularity. In some embodiments, the selected granularity and associated fuse(s)/fuse sets may be based on actually identifying or determining an amount of and/or a location of one or more defects (e.g., electric current relationships). In other embodiments, the selected granularity and associated fuses/fuse sets may be based on projected, expected, and/or calculated identifying or determining of an amount of and/or a location of one or more defects (e.g., electric current relationships), based on past yield, design parameters, required robustness, some combination, and/or other factors and/or parameters.

In some embodiments, selecting one or more plate pairs may be performed before and/or during an identifying and/or a determining of one or more electric current relationships between one or more plate pairs. For example, by detecting various features, qualities, and/or measurements at one or more various granularities, such as a section, one or more elements or components could report, identify, read, and/or determine performance factors and/or characteristics (e.g., timing, current, voltage, resistance, etc.) related to and/or specific to one or more granularities. Then, based on the detecting relating to one or more plates, as an example, a second plate and/or other plates and/or plate pairs related to the one or more plates may be selected. If one or more performance factors (among other detected information) increases, decreases, and/or is modified, then an electric current relationship (among other things) may exist between the one or more plates and the second plate. Then, additional pairings, selections, and/or shifts may be derived from the electric current relationship relating to the one or more plates and the second plate, among others.

Figure 5:
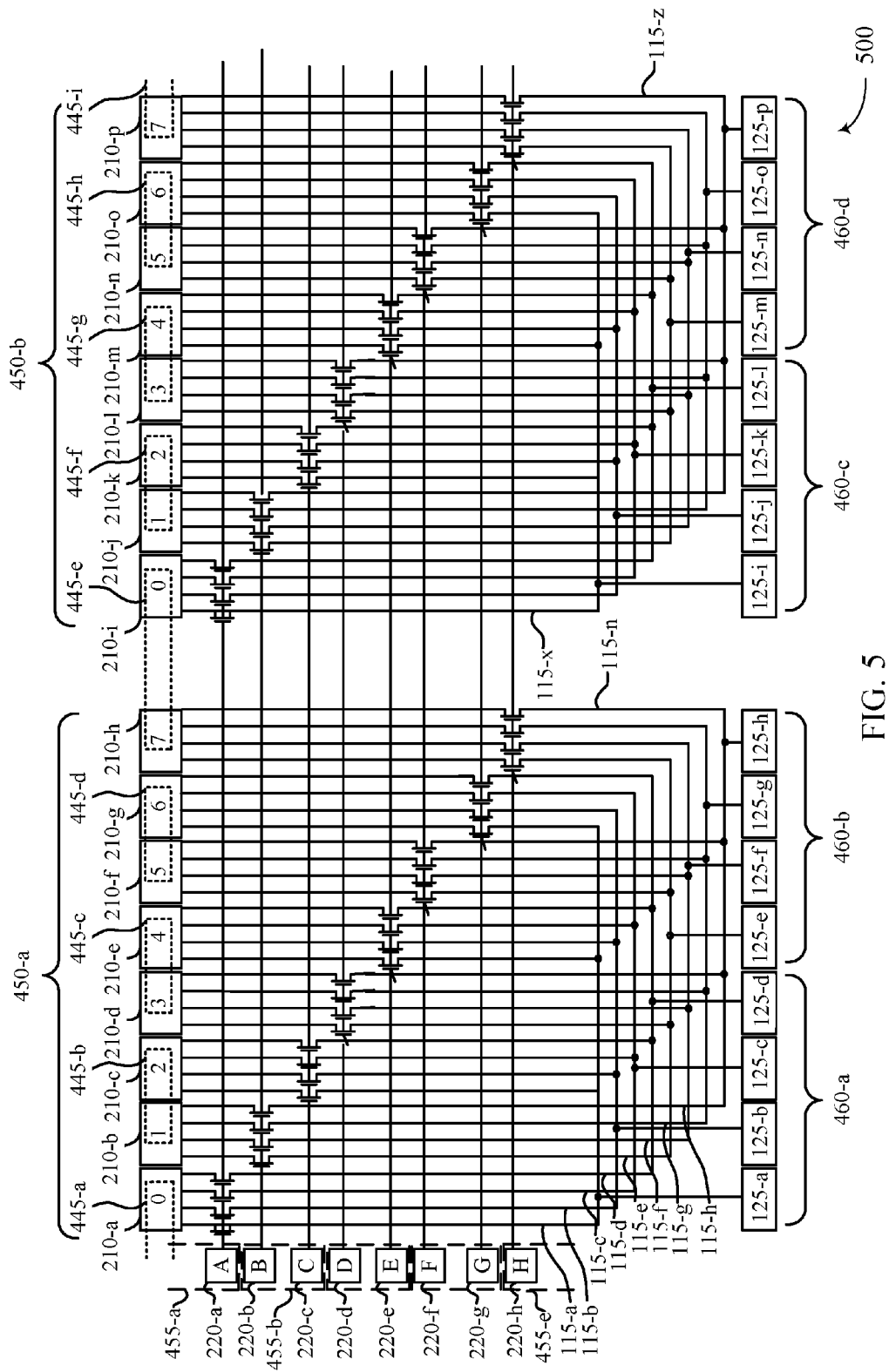
FIG. 5 illustrates an example of a memory array and other components that support selection of and operations relating to one or more cell plates in accordance with various embodiments of the present disclosure.

FIG. 5 illustrates an example array 500 that supports selection of and operations relating to one or more cell plates in accordance with various embodiments of the present disclosure. Array 500 may include a ferroelectric memory cell, one or more word lines, digit lines (e.g., 115-*a* to 115-*h*, 115-*n*, 115-*x*, 115-*z*, etc.), sense components 125 (e.g., 125-*a* to 125-*p*), plates 210 (e.g., 10-*a* to 210 *p*), and selection components 220 (e.g., 220-*a* to 220-*h*), which may be examples of a memory cell 105, word line 110, digit line 115, sense component 125, plates 210, and selection component 220, respectively, as described with reference to FIG. 1, 2, 4, or others. Array 500 may include a may include a logic storage component, such as a capacitor (e.g., capacitor 205 discussed with reference to FIG. 2), which may include conductive terminals, including plate 210 and cell bottom 215 (also discussed with reference to FIG. 2). These terminals may be separated by an insulating ferroelectric material. As described above, various states may be stored by charging or discharging capacitor 205. Array 500 may include feature similar to, the same as, or different from those discussed with respect to array 400 or other features, methods, techniques, and structures discussed with or relating to FIGS. 4 and 6, among others.

In accordance with various embodiments of the present disclosure, additional elements are contemplated, although each may not be explicitly labeled or shown. For example, in addition to selection component pair 455-*a* (relating to selection component 220-*a*), selection component pair 455-*b* (relating to selection component 220-*b* and selection component 220-*c*), and selection component pair 455-*e* (relating to selection component 220-*h*), array 500 may include additional components. For example, array 500 may include selection component pair 455-*c* (relating to selection component 220-*d* and selection component 220-*e*), selection component pair 455-*d* (relating to selection component 220-*f* and selection component 220-*g*), or both. As another example, array 500 may include four digit lines (or another number of digit lines per plate 210 (e.g., plate 210-*a*) that may be distinct and be separately identified, while only some of the digit lines shown are explicitly labeled (e.g., 115-*a* to 115-*h*, 115-*n*, and 115-*x* to 115-*z*, etc.).

Array 500 may also include plate pairs 445-*a* to 445-*i*, that relate to two or more of plates 210 (e.g., 210-*b* and 210-*c*). In some embodiments, plate pairs 445-*a* to 445-*i* may fall within one or more plate groups 450, such as plate group 450-*a* and 450-*b*, as shown in FIG. 5. Array 500 may also include selection component pairs 455 (e.g., 455-*a* to 455-*e*), that relate two selection components 220 (e.g., 220-*b* and 220-*c*). Array 500 may also include sense component groups 460-*a* to 460-*d*, that may relate to multiple sense components 125 (e.g., 125-*a* to 125-*d*).

In some embodiments, based on identifying an electric current relationship between two plates (e.g., plate 210-*b* and 210-*c*), two or more plates 210 may be selected. This selection may include grouping two cell plates into a plate pair (e.g., plate pair 445-*b*) to facilitate reading, writing, or other operations, despite the electric current relationship between the two plates.

As one example, plate 210-*b* (in the "1" position) and plate 210-*c* (in the "2" position) may have an electric current relationship, which may be understood as an "odd-even" electric current relationship (based on the "1" position and "2" position of the plates 210). In some embodiments, this electric current relationship may be identified or determined based on biasing one of the plates or some other method or technique. For example, by biasing plate 210-*b* for a read operation, and knowing that biasing plate 210-*b* should cause the plate 210-*c* to have a current or other value below a threshold, it may be determined that an electric current relationship exists between plate 210-*b* and plate 210-*c* if the current (or other value) of plate 210-*c* is above the threshold. In some embodiments, this identifying, determining, or selecting may be performed during testing, while in other embodiments, this identifying, determining, or selecting may be performed on a finished product that has a capability or one or more structural features to enable a selection of cell plates based on an electric current relationship.

In some embodiments, based on identifying this or other electric current relationships, plate pair 445-*b* may be selected. This selecting of plates 210-*b* and 210-*c* may be accompanied by selecting a selection component pair 455-*b* that selects selection component 220-*b* and 220-*c*, as one example. By selecting plates 210-*b* and 210-*c* and selection components 220-*b* and 220-*c* (and corresponding word and digit lines), each of the corresponding sensing components 125 (e.g., 125-*a* to 125-*h*) may be appropriately populated with data and sense component groups 460-*a* and 460-*b* may be fully populated to allow for read, write, and other operations.

In some embodiments, based on identifying an electric current relationship between plates 210-*b* and 210-*c* (as an example) within a first plate group 450-*a*, one or more other plate pairs 445 (e.g., 445-*c*, 445-*d*) may be selected. This selecting of plates 210-*f* and 210-*g* may be accompanied by selecting a selection component pair 455-*d* that selects selection component 220-*f* and 220-*g*. By selecting plates 210-*f* and 210-*g* and selection components 220-*f* and 220-*g* (and corresponding word and digit lines), each of sensing components 125 corresponding to the digit lines may be appropriately populated with data and the sensing component groups may be fully populated to allow for read, write, and other operations.

In some embodiments, one or more plates and one or more plate pairs may be selected based on a relationship relating to the one or more plates or the one or more plate pairs, or both. In some embodiments, this relationship may include a spatial relationship, such as an absolute location or locations, a relative location or locations of one, two, and/or more plates and/or pairs, plate addresses of one or more plates or related cells (including absolute or relative plate addresses, or both), some combination, or other things. In some embodiments, this relationship may include a location, such as a location proximate, directly or immediately next to, or adjacent to one, two, or more plates or pairs, among other things. In some embodiments, plates within a plate group (e.g., plate group 450-*a*) may be proximate and/or adjacent to other plates within the plate group. In some embodiments, plates within different plate groups (e.g., plate 210-*h* and plate 210-*i* of plate groups 450-*a* and 450-*b* respectively), may be located adjacent each other.

In some embodiments, based on identifying an electric current relationship between plates 210-*b* and 210-*c* (as an example) within a first plate group 450-*a*, one or more other plate pairs (e.g., 445-*a*, 455-*e*) may be selected. In some embodiments, a first plate (e.g., plate 210-*h*) may be selected with a second plate (e.g., plate 210-*i*), that may be related to a second plate group (e.g., plate group 450-*b*). In some embodiments, this selection may include a barrel shift, a barrel selection, a wraparound shift, or a wraparound selection, or some combination, among other variations. This selecting of plates 210-*h* and 210-*j* may be accompanied by selecting a selection component pair 455-*e* that selects selection component 220-*h* and one or more other selection components 220. In some embodiments, these one or more selection components 220 may include a selection component 220 associated with another group (e.g., the first selection component of another selection component group) or these one or more selection components 220 may include selection component 220-*a* from the first selection component pair 455 (e.g., a group) that may then be paired with selection component 220-*h*, or some combination.

Similarly, in some embodiments, a first plate (e.g., plate 210-*p*) may be selected with a second plate (e.g., plate 210-*a*, another plate [not shown]), that may be related to the first plate group (e.g., 450-*a*) and a third plate group (e.g., 450-*c*).

By selecting plates in an odd-even plate pair (e.g., 210-*f* and 210-*g* and selection components 220-*f* and 220-*g* (and corresponding word and digit lines), each of sensing components 125 corresponding to the digit lines 115 may be appropriately populated with data and the one or more sense component groups 460 may be fully populated to allow for read, write, or other operations.

For example, as shown in FIG. 4 the selection component 220 (e.g., 220-*a* to 220-*h*), which may in some embodiments each be an example of a transistor capable of being selected, are arranged to connect the respective digit lines (e.g., 115-*a* to 115-*h*) from respective plates (e.g., 210-*a* to 210-*h*) to the sense components (e.g., sense components 125-*a* to 125-*h*) to facilitate the selection of one or more plate pairs. Digit lines from some plates (e.g., plates 210-*a*, 210-*c*, 210-*e*, 210-*g*) may connect to or be in electronic communication with a first sense component group (e.g., sense component group 460-*a*). Digit lines from some plates (e.g., plates 210-*b*, 210-*d*, 210-*f*, 210-*h*) may connect to or be in electronic communication with a second sense component group (e.g., sense component group 460-*b*). In some embodiments, when one or more plate pairs (e.g., 445-*a*, 445-*b*, 445-*c*, 445-*d*) are selected regardless of each pair's order (e.g., odd-even, even-odd, some other order), the first sense component group and the second sense component group will be correctly populated with data. The same principles, actions, and operations apply equally to other embodiments, methods, and techniques described in the present disclosure.

In accordance with various embodiments of the present disclosure, one set of selection components (among other components or elements) may be in electronic communication with or relate to multiple plate groups, plates, or other sets of memory components. For example, one set of selection components (e.g., selection components 220-*a* to 220-*h*) may facilitate or perform selection of one or more plates related to one or more plate groups (e.g., plate group 450-*a*, plate group 450-*b*), or some combination of both.

Additionally alternatively, one or more other sets of selection components 220 (among other components or elements) may be in electronic communication with or relate to multiple plate groups, plates, and/or other sets of memory components. As an example, one set of selection components 220 (e.g., selection components 220-*a* to 220-*h*) may facilitate or perform selection of one or more plates related to one plate group (e.g., plate group 450-*a*) and another set of selection components 220 (e.g., selection components 220-*h* to 220-*p*) may facilitate or perform selection of one or more plates related to one or more other plate groups (e.g., plate group 450-*b*).

In some embodiments, the array 500 may include plate pairs (e.g., 445-*b*, 445-*c*, 445-*d*), that fall within the same plate group 450-*a* and may be selected based on an electric current relationship between plates within the plate group 450-*a* and/or one or more other plate groups.

In some embodiments, the array 500 may include plate pairs (e.g., 445-*a*, 445-*e*, 445-*f*, 445-*g*, 445-*h*), that fall within one or more other plate groups (e.g., 450-*b*, 450-*c*) and may be selected based on an electric current relationship between plates within the same plate group or one or more other plate groups, such as plate group 450-*a* and/or 450-*b*, among others. This selection may be based on one or more factors, including the granularity of the selection and/or related components, the array design, the existence of one or more electric current relationships, one or more plate group designs, one or more elements or components of the array and/or a memory cell and/or an electronic memory apparatus, performance relationships, current relationships, electronic communication relationships, status determinations and/or identifications, some combination, and/or other factors.

For example, in some embodiments, an element of array 500 (and/or some related component and/or element discussed in other figures, such as memory controller 140) may be configured to select the plate groups shown in FIG. 4 and/or FIG. 5 based on an electric current relationship between plates 210-*b* and 210-*c*. Based at least in part on determining (via a read or write operation or monitoring performance of one or more plates, among other methods and techniques) and/or identifying the electric current relationship, one or more elements (e.g., a fuse) associated with one or more groups of plate groups may initiate the selection of the plate pairs (e.g., 445-*a* to 445-*i*, etc.).

In some embodiments, the selection may be more granular and may apply only to the plates in the electric current relationship, those in the same plate group, in adjacent plate groups, and/or some other subsection of a larger memory sample.

In some embodiments, methods and techniques for operating a ferroelectric memory cell in accordance with various embodiments of the present disclosure are described. The methods and techniques may include identifying a first cell plate included in a first cell plate group, identifying a second cell plate that is adjacent to the first cell plate and included in the first cell plate group or a second cell plate group, and selecting the first cell plate and the second cell plate based at least in part on an electric current relationship between the first cell plate and the second cell plate, among other operations.

In some embodiments, an electric current relationship may include, among other things, a short between a first cell plate and the second cell plate. In some embodiments, an electric current relationship may include, among other things, a first current level of a first cell plate and/or a second current level of a second cell plate. In some embodiments, the first current level results from applying a voltage to a first cell plate and the second current level results from applying the voltage to a second cell plate.

In some embodiments, in accordance with various embodiments of the present disclosure, one or more cell plates may be contained in one or more groups and may be organized and/or ordered with one or more positions within the one or more groups. In some embodiments, the first cell plate and/or the second cell plate may be included in the first cell plate group. In some embodiments, the first cell plate may be included in the first cell plate group and/or the second cell plate may be included in the second cell plate group. In some embodiments, the first cell plate is in a last position in the first cell plate group and/or the second cell plate may be in a first position in the second cell plate group.

One operation that may be performed relating to one or more cell plates may include a reading operation, including a value-based or a logic-based reading operation. In some embodiments, methods and techniques for operating a memory cell in accordance with various embodiments of the present disclosure may include reading information from the first cell plate and the second cell plate based at least in part on reading information from a first sense amp in electronic communication with the first cell plate and a second sense amp in electronic communication with the second cell plate. In some embodiments, methods and techniques may include reading information from the first cell plate and the second cell plate in combination based at least in part on the selection.

In some embodiments, methods and techniques for operating a memory cell in accordance with various embodiments of the present disclosure may include identifying a third cell plate included in a third cell plate group, identifying a fourth cell plate included in the second cell plate group or the third cell plate group, identifying the third cell plate adjacent to the fourth cell plate, and selecting the third cell plate and the fourth cell plate as a pair based at least in part on the electric current relationship between the first cell plate and the second cell plate.

In some embodiments, in accordance with various embodiments of the present disclosure, one or more cell plates may be contained in one or more groups and may be organized or ordered with one or more positions within the one or more groups. In some embodiments, the third cell plate may be included in the third cell plate group and/or the fourth cell plate may be included in the second cell plate group. In some embodiments, the third cell plate may be in a first position in the third cell plate group and/or the fourth cell plate may be in a last position in the second cell plate group.

Figure 6:
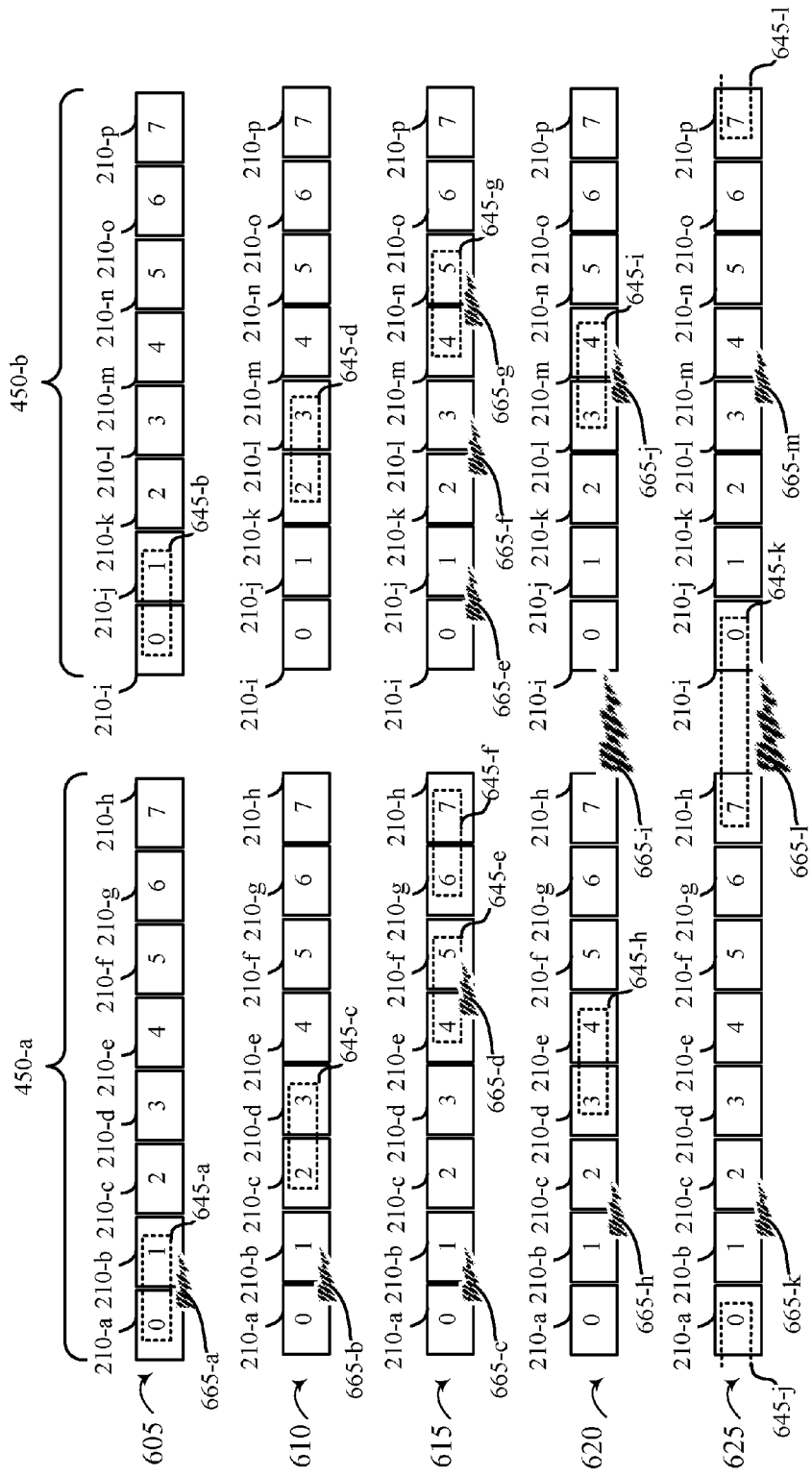
FIG. 6 illustrates exemplary memory arrays and relationships of components that support selection of and operations relating to one or more cell plates in accordance with various embodiments of the present disclosure.

FIG. 6 illustrates example arrays 605 to 625 that each support selection of and operations relating to one or more cell plates in accordance with various embodiments of the present disclosure. Each of arrays 605-625 may include a ferroelectric memory cell, one or more word lines, digit lines, one or more sense components, one or more plates (e.g., plates 210-*a* to 210-*p*), selection components, or plate groups (e.g., plate group 450-*a*, plate group 450-*b*), which may be embodiments of a memory cell 105, word lines 110, digit lines 115, sense components 125, plates 210, and/or selection components 220, respectively, as described with reference to FIG. 1, 2, 4, 5, or others. Each of arrays 605-625 may include features similar to, the same as, or different from those discussed with respect to array 400, array 500, and other features, methods, techniques, and structures discussed with or relating to FIGS. 1-5, among others.

In some embodiments, in accordance with various embodiments of the present disclosure additional elements are contemplated, although each may not be explicitly labeled and/or shown. For example, in addition to the plate groups (e.g., 450-*a*), the plates (e.g., 210-*a*), the plate pairs (e.g., 665-*a*), and the current performance relationships (e.g., 665-*a*), shown in FIG. 6, other elements or components disclosed, described, or contemplated based on FIGS. 1-5, among others are also envisioned. For example, although FIG. 6 does not explicitly show digit lines, word lines, selection components, sensing components, or other elements described or shown in FIGS. 1-5 (among others), each of these, alone or in combination are contemplated by the present disclosure, including in the embodiments shown and described relative to FIG. 6.

The example arrays 605 to 625 illustrate various electric current relationship, including shorts, that may existing between cell plates of the arrays.

As shown in example array 605, plates 210-*a* through 210-*h* are organized as part of plate group 450-*a* and plates 210-*i* through 210-*p* are organized as part of plate group 450-*b*. In some embodiments, based at least in part on one or more identifications or determinations, an electric current relationship 665-*a* is detected. Based at least in part on this detection of electric current relationship 665-*a*, one or more plate pairs (e.g., plate pair 645-*a*) is selected by one or more system elements or components. In some embodiments, a first plate pair 645-*a* is identified as corresponding to the even-odd relationship of plates 210-*a* and 210-*b* relating to electric current relationship 665-*a*. As discussed in the present disclosure, one or more elements may perform the selection of plates 210-*a* and 210-*b* based at least in part on the detected electric current relationship 665-*a* is directly related to plates 210-*a* and 210-*b*.

In some embodiments, the plate pair 645-*a* may be individual and no other plate pair in the same plate group (e.g., plate group 450-*a*) or in other plate groups (e.g., plate group 450-*b*) may be selected based at least in part on the electric current relationship 665-*a*. This single pair granularity in identifying, determining, or selecting may apply in certain designs or other embodiments. For example, this single pair selection decreases power consumption associated with alternative embodiments that may require reading, writing, or performing other operations based on multiple, numerous, or every two plates in sections, columns, dies, bank, and/or other structures.

In some embodiments, the plate pair 645-*a* may be individual to a first plate group (e.g., 450-*a*) and may relate to or otherwise correspond with plate pair 645-*b*, as shown in example array 605. In this example, one or more elements or components may select one plate pair in a first group (e.g., plate group 450-*a*) and one plate pair in one or more other plate groups (e.g., plate group 450-*b*). In some embodiments, these plate pairs (e.g., 645-*a* and 645-*b*) may be selected based on the electric current relationship 665-*a*, among other parameters, factors, or conditions relating to array 605 or other system elements or components. In some embodiments, a selection of plate pair 645-*a* and 645-*b* may be based on determining the electric current relationship 665-*a* that affects a first plate in a first group (e.g., plate 210-*a* of plate group 450-*a*) and a second plate in the first group (e.g., plate 210-*b* of plate group 450-*a*). In some embodiments, based on identifying the electric current relationship 665-*a*, a selection of plate pair 645-*b* may be performed before, during or after a selection of plate pair 645-*a* is performed. Thus, the indirect selection of plates 210-*i* and 210-*j* may be based on an electric current relationship between other plates (e.g., plates 210-*a*, and 210-*b* in array 605) may be performed independent of, in addition to, instead of, or otherwise be related to the direct selection based on the electric current relationship (e.g., 665-*a*) between the specific plates having the electric current relationship (e.g., plates 210-*a* and 210-*b* in array 605).

As shown in example array 610, plates 210-*a* through 210-*h* are organized as part of plate group 450-*a* and plates 210-*i* through 210-*p* are organized as part of plate group 450-*b*. In some embodiments, based on one or more identifications or determinations, electric current relationship 665-*b* is detected (e.g., identified, determined, etc.). Based at least in part on this detection of electric current relationship 665-*b*, one or more plate pairs (e.g., plate pair 645-*c*) is selected by one or more system elements or components. In some embodiments, a first plate pair 645-*c* is identified as corresponding to the even-odd relationship of plates 210-*a* and 210-*b* relating to electric current relationship 665-*b*. As discussed in the present disclosure, one or more elements may perform the selection of plates 210-*c* and 210-*d* based on the detected electric current relationship 665-*b* that is indirectly related to plates 210-*c* and 210-*d*. In addition, based on the detection of electric current relationship 665-*b*, the selection of plate pair 645-*c*, some combination, and/or other information, plate pair 645-*d* may be selected. In some embodiments, plate pair 645-*d* may be selected based on the relative position of each plate (e.g., plate 210-*k* being in the "2" position and plate 210-*l* being in the "3") and this may or may not be related to the relative position of one or more other plates (e.g., plate 210-*c* being in the "2" position and plate 210-*d* being in the "3").

In some embodiments, as shown in example array 610, plate pair 645-*d* may correspond to the relative position of plate pair 645-*c* (which includes plate 210-*c* and plate 210-*d*), shown in the "2" and "3" position of plate group 450-*a*. In some embodiments, as shown in example array 610, plate pair 645-*d* may correspond to the relative location of and ordered of electric current relationship 665-*b* (which is based on plates 210-*a* and 210-*b*), shown in the "0" and "1" position of plate group 450-*a*. For example, the ordered of electric current relationship 665-*b* (e.g., even-odd) may at least partially affect or otherwise influence selection of plate pair 645-*d* (relating to plates 210-*k* and 210-*l*).

In some embodiments, as shown in example array 615, multiple electric current relationships may exist between plates in one or more plate groups. For example, one or more identifications or determinations may be performed to determine at least one of electric current relationship 665-*c* and electric current relationship 665-*d* that may each affect two or more plates (e.g., plates 210-*a*, 210-*b*, 210-*e*, 210-*f*), among other elements or components.

In some embodiments, based on identifying or determining electric current relationship 665-*c* or electric current relationship 665-*d*, one or more selections may be made that correspond to plate pair 645-*e* or 645-*f*, among others. By comparing the spatial relationship of one or more electric current relationships, the order of plates, the relative position of plates (even-odd, odd-even), and/or other factors, one or more plate pairs may be selected using a controller, one or more fuses, one or more other elements or components, some combination, and/or other structures.

Alternatively or additionally, based on identifying or determining (among other operations) one or more electric current relationships in one or more plate groups, specific plate pairs (e.g., 645-*e*, 645-*f*, 645-*g*) are selected. In some embodiments, this selection may be based on identifying or determining some, a majority of, or all electric current relationship present in one plate group, multiple plate groups, or every plate group within a certain die, bank, section, group, and/or other subset. For example, by identifying, comparing, or otherwise determining electric current relationships 665-*c*, 665-*d*, 665-*e*, 665-*f*, and 665-*g* one or more plate pairs (e.g., 645-*e*, 645-*f*, 645-*g*) may be selected. In some embodiments, this detection may be based on comparing or determining whether each electric current relationship is an even-odd or an odd-even electric current relationship.

In some embodiments, this detection may be based on comparing and/or determining whether one or more electric current relationships is determined to be similar to one or more other electric current relationships, without determining whether the one or more electric current relationships is odd-even, even-odd, affects the first and the second plates, affects the second and the third plates, and/or some combination. For example, this detection may be based on comparing and/or determining whether electric current relationship 665-*c* is similar to electric current relationship 665-*d* and/or electric current relationship 665-*e*, without a determination of whether each of the electric current relationships is even, even-odd, affects the first and the second plates, affects the second and the third plates, affects other plates, and/or some combination.

In other embodiments, this detection may be made independent of or dependent on comparing or determining whether each electric current relationship is an even-odd or an odd-even electric current relationship.

In some embodiments, as shown in example array 620, multiple electric current relationships may exist between plates in a first plate group, a second plate group, and/or between a first plate and a second plate group (among other variations). For example, one or more identifications or determinations may be performed to determine at least one of electric current relationship 665-*h*, 665-*i*, and 665-*j* that each affect two or more plates (e.g., plates 210-*b* and 210-*c*, 210-*h* and 210-*i*, 210-*l* and 210-*m*), among other elements or components.

In some embodiments, based on identifying or determining one or more of electric current relationships 665-*h*, 665-*i*, and/or 665-*j*, one or more selections may be made that correspond to plate pair 645-*h* or 645-*i*, among others, or some combination. By comparing the spatial relationship of one or more electric current relationships, the order of plates, the relative position of plates (even-odd, odd-even), and/or other factors, one or more plate pairs may be selected. In some embodiments, selection may be based on one or more of electric current relationships between distinct plate groups and/or subgroups. For example, as shown in example array 620, one or more of electric current relationships (e.g., electric current relationships 665-*i*) may be present between a first plate group (e.g., 450-*a*) and a second plate group (e.g., 450-*b*), or between the second plate group (e.g., 450-*b*) and an additional plate group (e.g., a third plate group).

Based at least in part on the one or more of electric current relationships between two or more plate groups, one or more plate pairs or groups may be selected. In some embodiments, based on determining a first electric current relationship (e.g., electric current relationship 665-*i*) one or more plate pairs may be selected. The one or more plate pairs selected may include those in similar absolute and/or relative positions (e.g., position "7" and position "0"), may be of similar order (e.g., odd-even like electric current relationship 665-*i*), and/or other factors.

In some embodiments, selecting one or more plate pairs may be based on determining that two or more electric current relationships (e.g., electric current relationship 665-*i* and electric current relationship 665-*j*) affect one plate group. By determining that the two or more electric current relationships affect the one plate group (e.g., plate group 450-*b*), one or more selections may be made with respect to the affected plate group (e.g., plate group 450-*b*) and/or one or more other plate groups (including, but not limited to, two or more other plate groups that border or are adjacent to plate group 450-*b* and those that do not border or are not adjacent to plate group 450-*b* but may still be contained within the same die bank or section).

In some embodiments, as shown in example array 625, multiple electric current relationships may exist between plates in a first plate group, a second plate group, or between a first plate and a second plate group (among other variations). For example, one or more identifications or determinations may be performed to determine at least one of electric current relationship 665-*k*, 665-*l*, and/or 665-*m* that each affect two or more plates (e.g., plates 210-*b* and 210-*c*, 210-*h* and 210-*i*, 210-*l* and 210-*m*), among other elements or components.

In some embodiments, based on identifying or determining one or more of electric current relationships 665-*k*, 665-*l*, and/or 665-*m*, one or more selections may be made that correspond to plate pair 645-*j*, 645-*k*, and/or 645-*l*, among others. By comparing the spatial relationship of one or more electric current relationships, the order of plates, the relative position of plates (even-odd, odd-even), and/or other factors, one or more plate pairs may be selected. In some embodiments, selection may be based on one or more of electric current relationships between distinct plate groups. For example, as shown in example array 625, one or more of electric current relationships (e.g., electric current relationships 665-*l*) may be present between a first plate group (e.g., 450-*a*) and a second plate group (e.g., 450-*b*), and/or between the second plate group (e.g., 450-*b*) and an additional plate group (e.g., a third plate group).

Based at least in part on the one or more of electric current relationships between two or more plate groups, one or more plate pairs or groups may be selected. In some embodiments, based on determining a first electric current relationship (e.g., electric current relationship 665-*l* or 665-*k*) one or more plate pairs may be selected. The one or more plate pairs selected may include those in similar absolute or relative positions (e.g., position "7" and position "0" as depicted by plate pair 645-*k*), may be of similar order (e.g., odd-even like electric current relationship 665-*i* or 665-*l*), and/or other factors.

In some embodiments, selecting one or more plate pairs may be based on determining that two or more electric current relationships have a similar order (e.g., odd-even, even-odd) and/or the relative position of at least one of the plates in a plate pair (e.g., plate pair 645-*k*). For example, an initial determination may be made regarding the order of some, a majority of, and/or all detected electric current relationships within a designated set (e.g., section, die, bank, group, subset). By determining that at least one of the detected electric current relationship(s) (e.g., electric current relationship 665-*i* and electric current relationship 665-*j*) affect a specific plate and/or a specific plate pair (e.g., based on an odd-even order, affect plate in position "7" such as 210-*h*, etc.), a plate pair including at least one plate from a first plate group and at least one plate from a second plate group may be selected (e.g., a first plate and plate 210-*a* as shown by plate pair 645-*j*, plate 210-*h* and 210-*i* as shown by plate pair 645-*k*, etc.).

In some embodiments, the selection may be based on determining whether each electric current relationship (e.g., 665-*k*, 665-*l*, 665-*m*) includes a particular order (or not) such as even-odd or odd-even (or more sophisticated orders involving additional plates) and if all of the plate relationships are similar based on the relative position (e.g., position "0" or "4" or "7") of one or more plates directly and/or indirectly affected by at least one electric current relationship.

In some embodiments, the selection may be based on determining whether a subset of the electric current relationships (e.g., 665-*l*) includes a particular order (or not) such as even-odd or odd-even (or more sophisticated orders involving additional plates) and performing a selection irrespective of the existence of one or more other electric current relationships, the order of the plates of one or more other electric current relationships, the absolute or the relative position of one or more other electric current relationships, some combination, or other factors. For example, based on determining or identifying electric current relationship 665-*l*, a selection of plates 210-*h* and/or 210-*i* may be made to form plate pair 645-*k*. Alternatively, or additionally, based on the identifying or the determining regarding plate pair 645-*k* all other similarly positioned pairs within a section and/or other granularity (e.g., bank, die) may be selected. For example, based on the identifying or the determining regarding plate pair 645-*k*, other plate pairs in the same positions (e.g., positions "7" and "0" in this example) may be paired leading to selecting plate pair 645-*j* or plate pair 645-*l*, among others.

Alternatively, or additionally, based on the identifying or the determining regarding plate pair 645-*k* all other plates within a section and/or other granularity (e.g., bank, die) may be selected in a similar fashion. For example, based on the identifying or the determining regarding plate pair 645-*k*, all other plates irrespective of their position and/or other characteristics may be paired leading to selecting plates 210-*b* and 210-*c*, 210-*d* and 210-*e*, 210-*f* and 210-*g*, 210-*j* and 210-*k*, 210-*l* and 210-*m*, 210-*n* and 210-*o*, a first plate and plate 210-*a* in plate pair 645-*j*, a second plate and plate 210-*p* in plate pair 645-*l*, and/or others.

In some embodiments, electronic memory apparatuses in accordance with various embodiments of the present disclosure are described. The electronic memory apparatuses may include a first cell plate group, a second cell plate group, a first cell plate included in the first cell plate group, or a second cell plate adjacent to the first cell plate and included in the first cell plate group or the second cell plate group. In some embodiments, the first cell plate and the second cell plate may be in electronic communication.

In some embodiments, the electronic communication may include, among other things, a short between a first cell plate and the second cell plate. In some embodiments, the electronic communication is based on a proximity of the first cell plate to the second cell plate. As described in accordance with various embodiments of the present disclosure, the proximity may include one or more absolute locations or positions, relative locations or positions, a position adjacent another cell plate in the same group, a position adjacent another cell plate in at least one other group, some combination, or other variations.

In some embodiments, electronic memory apparatuses in accordance with various embodiments of the present disclosure may include a first digit line in electronic communication with the first cell plate and a first sense amp via a first transistor. In some embodiments, electronic memory apparatuses in accordance with various embodiments of the present disclosure may include a second digit line in electronic communication with the second cell plate and a second sense amp via a second transistor. In some embodiments, the first transistor and/or the second transistor may be embodiments of a sense component in accordance with various embodiments of the present disclosure.

In some embodiments, in accordance with various embodiments of the present disclosure, one or more cell plates may be contained in one or more groups and may be organized and/or ordered with one or more positions within the one or more groups.

In some embodiments, the first cell plate and the second cell plate are each included in the first cell plate group. In some embodiments, the first cell plate is included in the first cell plate group and the second cell plate is included in the second cell plate group. In some embodiments, the first cell plate is included in one cell plate group and the second cell plate is included in another cell plate group different from the cell plate group of the first cell plate. In some embodiments, the first cell plate is in a first position in the first cell plate group and the second cell plate is in a last position in the second cell plate group. In some embodiments, the first cell plate is in a last position in the first cell plate group and the second cell plate is in a first position in the second cell plate group. In some embodiments, the first cell plate is not in a first position in the first cell plate group and/or the second cell plate is not in a last position in the second cell plate group.

In some embodiments, in addition to employing the methods and the techniques that support selection of and operations relating to cell plates and plate pairs as described in the present disclosure, additional methods and techniques involving redundant memory elements or components may be used. For example, certain design parameters may require having a redundancy level that may have required whole redundant sections (and/or more localized, but more costly redundancy based on groups, etc.). But based on the use of plate selection and use of one or more plate pairs within a plate group, section, bank, die, or other organization, the need for redundant sections may be greatly reduced (and in some embodiments eliminated), decreasing the costs of redundant memory sections and avoiding expensive localized redundancy controls (e.g., plate groups, etc.). The use of the plate selection techniques and methods associated herein enable existing memory elements to be more robust and avoid wholesale discarding of groups, sections, bank, and/or dies based on minor electric current performance relationships, that may include shorting between vertical cut plates, among other things.

For example, where a traditional design may have required multiple redundant sections based on one or more of yield constraints defect density, and/or technology-dependent choices, the use of plate pairs and selection techniques relating to one or more plate pairs in a plate group, a section, a die, a bank, a column, and/or another granularity may reduce the required redundancy by in effect making the element more efficient and robust by using plate selection.

In some embodiments, associated methods and techniques may include identifying a redundancy or a robustness factor or requirement, determining how plate selection and/or shifting of one or more plate pairs will affect the redundancy or the robustness factor or requirement, and/or reducing the redundancy or the robustness factor or requirement based on the determining. These steps, among others, may be performed before, as part of, or after a plate selection step or other steps in accordance with various embodiments of the present disclosure.

This hybrid solution (including plate selection and a reduced amount of redundant memory) may enable memory apparatuses and products to provide additional features and capabilities without requiring the fully-duplicative, and overly-expensive solely redundant memory solutions. In certain designs, employing the plate selection techniques and methods may reduce brute redundancy number from three redundant sections to one redundant section, as merely one example. But, in many embodiments, the techniques and the methods described through the present disclosure support selection of, shifting of, and operations relating to cell without the need for brute redundancy or hybrid techniques.

The example arrays 605 to 625 that each support selection of and operations relating to cell plates merely serve as embodiments in accordance with various embodiments of the present disclosure. Each of these embodiments may be modified, adjusted, duplicated, include additional steps, omit some steps, or otherwise adjusted based at least in part on the various embodiments and circumstances described.

Figure 7:
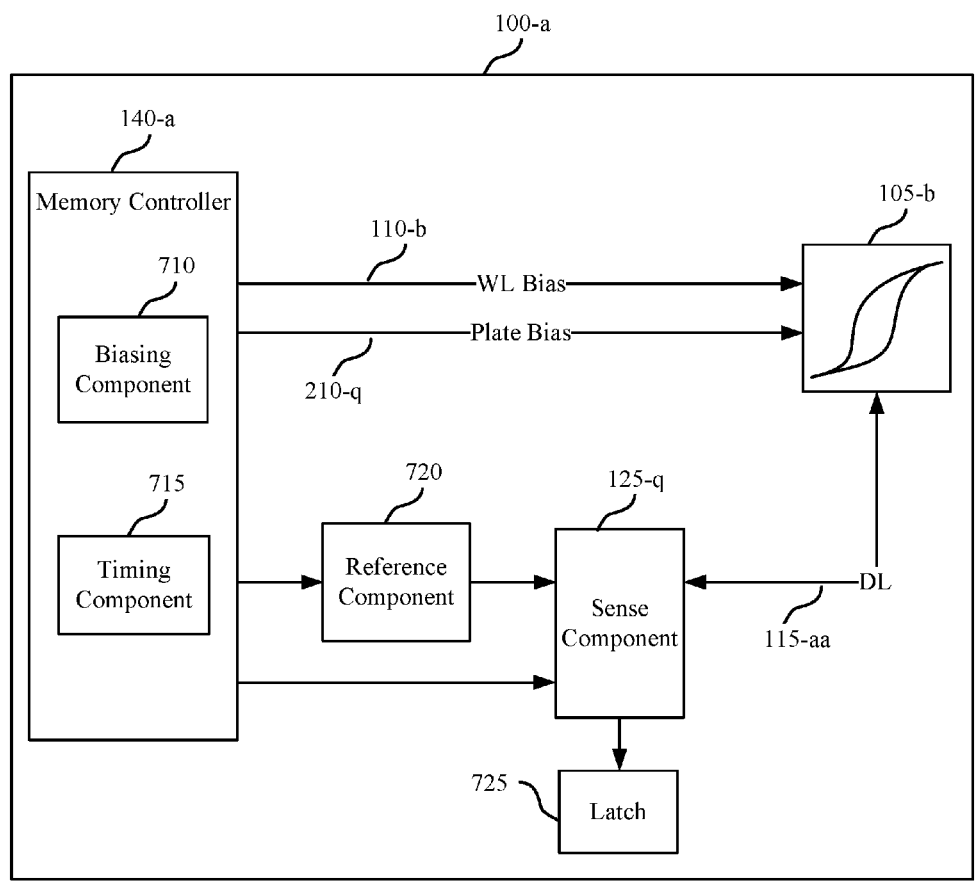
FIG. 7 illustrates a memory array that supports selection of and operations relating to one or more cell plates in accordance with various embodiments of the present disclosure.

FIG. 7 shows a block diagram 700 of a memory array 100-*a* that supports selection of and operations relating to one or more cell plates in accordance with various embodiments of the present disclosure. Memory array 100-*a* may be referred to as an electronic memory apparatus and may include memory controller 140-*a* and memory cell 105-*b*, which may be embodiments of memory controller 140 and memory cell 105 described with reference to FIGS. 1 and 2, among others. Memory controller 140-*a* may include biasing component 710 and timing component 715 and may operate memory array 100-*a* as described in FIGS. 1-3, among others. Memory controller 140-*a* may be in electronic communication with word line 110-*b*, digit line 115-*aa*, sense component 125-*q*, and/or plate 210-*q*, which may be embodiments of word line 110, digit line 115, sense component 125, and plate 210 (among other embodiments) described with reference to FIG. 1-2 or 3-6, among others. Memory array 100-*a* may also include reference component 720 or latch 725. The components of memory array 100-*a* may be in electronic communication with one another and may perform the functions described with reference to FIGS. 1-6, among others. In some embodiments, reference component 720, sense component 125-*q* and latch 725 may be components of memory controller 140-*a*.

Memory controller 140-*a* may be configured to activate word line 110-*b*, plate 210-*q*, or digit line 115-*q* by applying voltages to various nodes. For example, biasing component 710 may be configured to apply a voltage to operate memory cell 105-*b* to read or write memory cell 105-*b*, as described above. In some embodiments, memory controller 140-*a* may include a row decoder, column decoder, or both, as described with reference to FIG. 1, among others. This may enable memory controller 140-*a* to access one or more memory cells 105. Biasing component 710 may also provide voltage potentials to reference component 720 in order to generate a reference signal for sense component 125-*q*. Additionally, biasing component 710 may provide voltage potentials for the operation of sense component 125-*q*.

In some embodiments, memory controller 140-*a* may perform its operations using timing component 715. For example, timing component 715 may control the timing of the various word line selections or plate biasing, including timing for switching and voltage application to perform the memory functions, such as reading and writing, discussed herein. In some embodiments, timing component 715 may control the operations of biasing component 710.

In some embodiments, Reference component 720 may generate a reference signal for sense component 125-*q*. Reference component 720 may, for example, include circuitry configured to produce a reference signal. In some embodiments, reference component 720 may be other ferroelectric memory cells 105. In some embodiments, reference component 720 may be configured to output a voltage with a value between the two sense voltages, as described with reference to FIG. 3, among others. Or reference component 720 may be designed to output a virtual ground voltage (i.e., approximately 0V).

In some embodiments, sense component 125-*l* may compare a signal from memory cell 105-*b* (through digit line 115-*aa*) with a reference signal from reference component 720. Upon determining the logic state, the sense component may then store the output in latch 725, where it may be used in accordance with the operations of an electronic device using memory array 100-*a*, among other components or elements.

In some embodiments, memory controller 140-*a* may be related to or in electronic communication with a first cell plate and a second cell plate, which may each be embodiments of various plates 210 (described with reference to FIGS. 1-6, among others). A first digit line may be in electronic communication with the first cell plate and a first sense component (e.g., a sense amp) via a first selection component (e.g., a transistor). A second digit line may also be in electronic communication with the second cell plate and a second sense component (e.g., a sense amp) via a second selection component (e.g., a transistor). In some embodiments, the memory controller 140-*a* may be in electronic communication with one or more elements of memory array 100-*a* (among other memory arrays and/or memory apparatuses), including, but not limited to, a first sense component and/or a second sense component.

Based at least in part on the electronic communication, the controller may be operable to initiate and/or perform one or more operations. In some embodiments, the memory controller 140-*a* may be operable to determine or identify an electric current relationship relating to one plate 210 (e.g., 210-*q*), relating to two distinct, proximate, or adjacent plates (e.g., two plates as described with reference to FIGS. 4-6, among others), relating to one or more plates in a single plate group, relating to two or more plates at least one of which is included in a plate group or a section different from the others, some combination, and/or other components or elements.

In some embodiments, this determining may include measuring, reading, writing, calculating, comparing, correlating, verifying, linking, analyzing, estimating, or assessing one or more characteristics, values, measurements, current or voltage levels or relationships, locations, performance relationships, operations, and/or other parameters specific to, relating to, or based on one or more plates, digit lines, sense components, selection components, and/or plate groups, among other things. In some embodiments, this identifying may include detecting, distinguishing, comparing, associating, relating, measuring, reading, linking, linking, analyzing, estimating, and/or assessing one or more characteristics, values, measurements, current or voltage levels or relationships, locations, performance relationships, operations, and/or other parameters specific to, relating to, or based on one or more plates, digit lines, sense components, selection components, or plate groups, among other things. As one example, memory controller 140-*a* may determine and/or identify an electric current relationship between a first cell plate and a second cell plate, which may be based at least in part on reading and/or otherwise receiving information from one or more sense components each related to at least one of the first cell plate and the second cell plate.

Based at least in part on this determining or identifying, the memory control may initiate (e.g., send an instruction or a signal to, or control another element or component to operate to) or operate to select the first cell plate and the second cell plate based at least in part on a spatial relationship. This selection may, in some embodiments, include an electronic communication from the controller to one or more selection components, which may include communication with two or more selection components (e.g., including one or more selection component pairs) based at least in part on the determining or identifying. In some embodiments, this spatial relationship may be based at least in part on an absolute position or a relative position of one or more cell plates or other elements or components.

In some embodiments, this spatial relationship may be based at least in part on the location of a first cell plate relative to a second cell plate, including whether these cell plates (and/or others) are adjacent, proximate, in a particular order, in a relative position within a group, and/or otherwise related to each other (and/or other cell plates and/or elements or components). For example, the selection may include and/or be based at least in part on a spatial relationship relating to a position of the first cell plate in a first cell plate group relative to the second cell plate in the first cell plate group. The selection may include and/or be based at least in part on a position of the first cell plate in a first cell plate group being in a "7" position (e.g., a last or a final position) and second cell plate in the first cell plate group being in a "0" position (e.g., a first or an initial position), a "4" position (e.g., in a non-endpoint, intermediate position), or in a "6" position (e.g., an adjacent position).

Additional cell plates may be selected (via the memory controller and/or one or more other elements or components). For example, in some embodiments, a third cell plate may be included in the first cell plate group and a fourth cell plate may be included in the first cell plate group, where each of these cell plates may be identified and/or determined as relating to the first cell plate and the second cell plate, among other elements or components. In some embodiments, memory controller 140-*a* may be operable to select the third cell plate and the fourth cell plate based at least in part on a spatial relationship. For example, the third cell plate and/or the fourth cell plate may be selected based at least in part on determining that the third cell plate is adjacent to at least one of (and in some embodiments, both of) the first cell plate and the fourth cell plate.

This selection of the third cell plate and the fourth cell plate may, in some embodiments, be based at least in part on a spatial relationship of the third and fourth cell plates themselves. In other embodiments, this selection of the third cell plate and the fourth cell plate may be based at least in part on a spatial relationship between the first cell plate and the second cell plate. In other embodiments, this selection of the third cell plate and the fourth cell plate may be based at least in part on a spatial relationship between at least one of the first cell plate and the second cell plate with the third cell plate and the fourth cell plate.

In some embodiments, the memory controller 140-$a$ may initiate or be operable to read information from at least one of the first sense component and the second sense component (among other elements or components) based at least in part on the selection. This may include, in some embodiments, the memory controller 140-$a$ reading values from a first sense amp and a second sense amp on two or more selected transistors that correspond and/or otherwise relate to two plates having and/or relating to an electric current relationship, among other factors.

Figure 8:
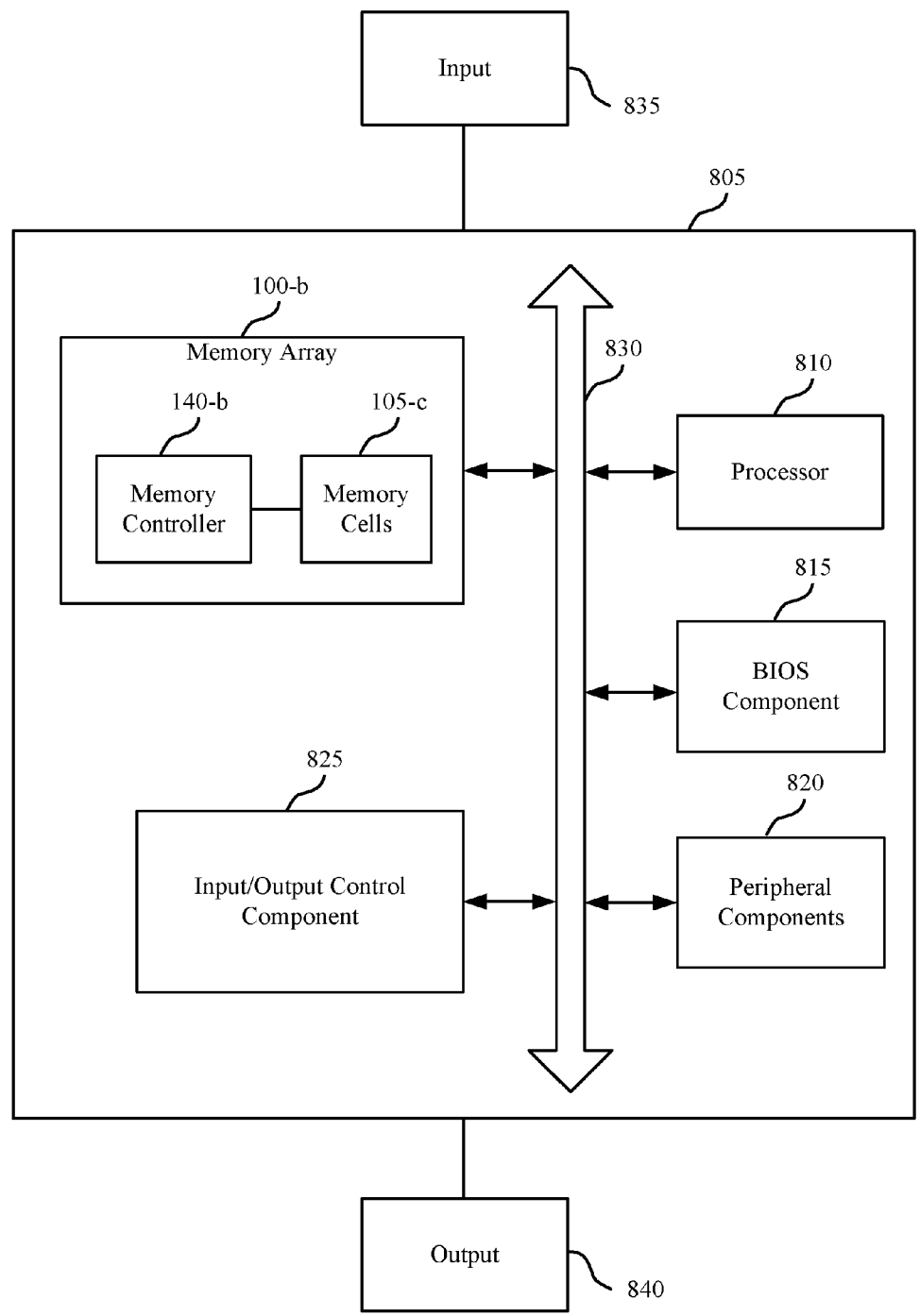
FIG. 8 illustrates a system, including a memory array, that supports selection of and operations relating to one or more cell plates in accordance with various embodiments of the present disclosure.

FIG. 8 shows a diagram of a system 800 that supports selection of and operations relating to one or more cell plates in accordance with various embodiments of the present disclosure. System 800 may include a device 805, which may be or include a printed circuit board to connect or physically support various components. Device 805 may include a memory array 100-$b$, which may be an example of memory array 100 described in FIG. 1 and FIG. 7, among others. Memory array 100-$b$ may contain memory controller 140-$b$ and one or more memory cells 105-$c$, which may be embodiments of memory controller 140 described with reference to FIGS. 1 and 7, among others, and memory cells 105 described with reference to FIGS. 1, 2, and 7, among others. Device 805 may also include a processor 810, BIOS component 815, one or more peripheral components 820, and/or input/output control component 825, among other components or elements. The components of device 805 may be in electronic communication with one another through bus 830.

Processor 810 may be configured to operate memory array 100-$a$ through memory controller 140-$b$. In some embodiments, processor 810 performs the functions of memory controller 140 or 140-$a$, described with reference to FIGS. 1 and 7, among others. In other embodiments, memory controller 140-$b$ may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including performing identifying, determining, or selecting relating to one or more cell plates and/or other components or elements. Processor 810 may, for example, be configured to execute computer-readable instructions stored in memory array 100-$a$ to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output controller component 825, etc. BIOS component 815 may include a program or software stored in read-only memory (ROM), flash memory, or any other non-volatile memory.

One or more peripheral components 820 may be any input or output device, or an interface for such devices, that is integrated into device 805. Embodiments may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output controller component 825 may manage data communication between processor 810 and peripheral components 820, input devices 835, or output devices 840. Input/output controller component 825 may also manage peripherals not integrated into device 805. In some embodiments, input/output controller component 825 may represent a physical connection or port to the external peripheral.

Input 835 may represent a device or signal external to device 805 that provides input to device 805 or its components. This may include a user interface or interface with or between other devices. In some embodiments, input 835 may be a peripheral that interfaces with device 805 via peripheral components 820 or may be managed by input/output controller component 825.

Output device 840 may represent a device or signal external to device 805 configured to receive output from device 805 or any of its components. Embodiments of output device 840 may include a display, audio speakers, a printing device, another processor or printed circuit board, etc. In some embodiments, output device 840 may be a peripheral that interfaces with device 805 via peripheral components 820 or may be managed by input/output controller component 825.

The components of memory controller 140-$b$, device 805, and memory array 100-$b$ may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
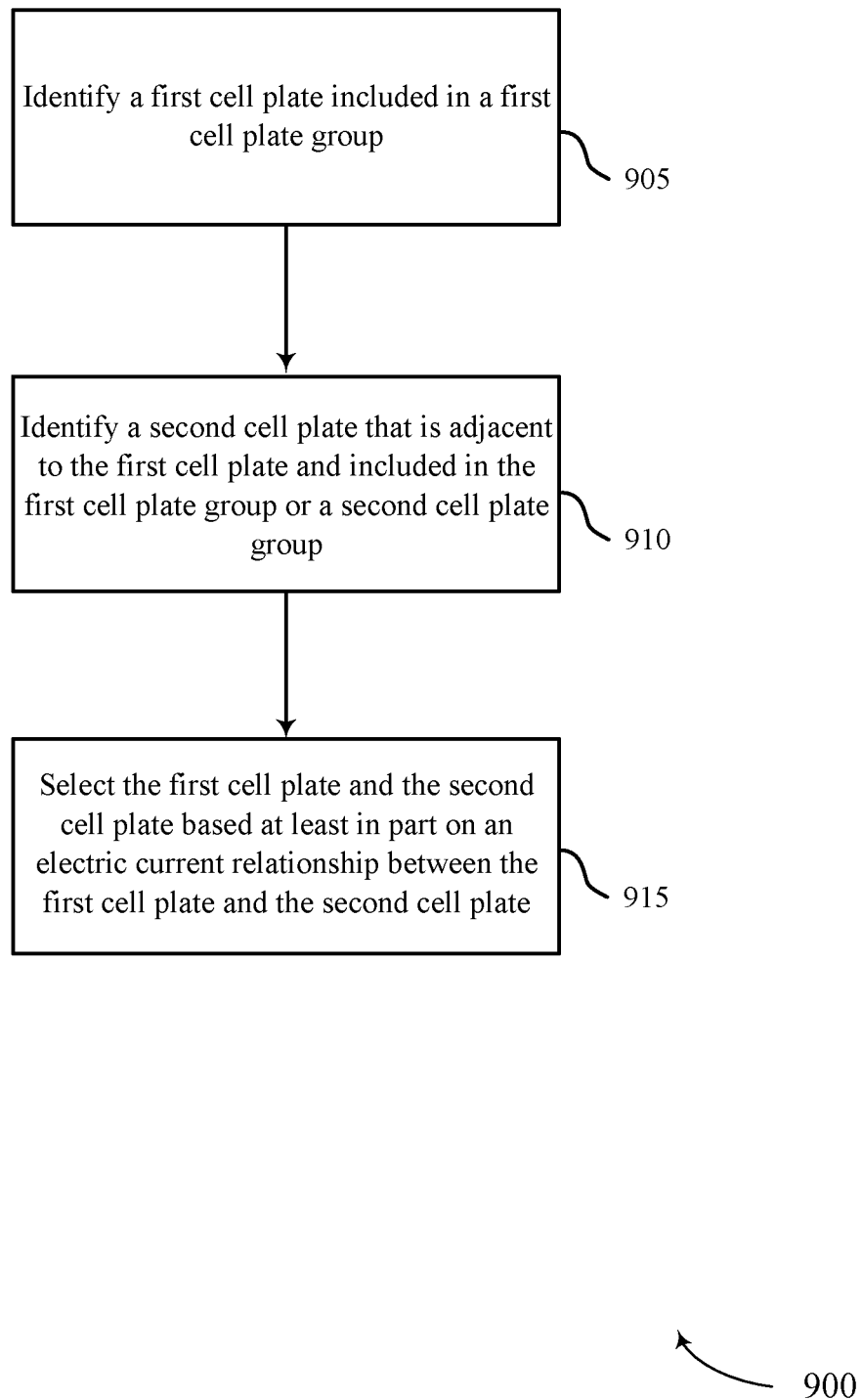
FIGS. 9 and 10 are flowcharts that illustrate methods for selection of and operations relating to one or more cell plates in accordance with various embodiments of the present disclosure.

FIG. 9 shows a flowchart illustrating a method 900 of selection of and operations relating to one or more cell plates in accordance with various embodiments of the present disclosure. The operations of methods and techniques discussed with reference to FIGS. 4-8, among others, may be implemented by a memory array 100 as described with reference to FIGS. 1-8. For example, the operations of method and techniques relating FIGS. 4-6, among others, may be performed by a memory controller 140 as described with reference to FIGS. 1, 7 and 8, among others. In some embodiments, a memory controller 140 may execute a set of codes to control the functional elements of the memory array 100 to perform the functions described below. Additionally or alternatively, the memory controller 140 may perform embodiments of the functions described below using special-purpose hardware. Additionally or alternatively, the memory controller 140 may initiate one or more signals and/or instruction to enable one or more other components or elements to perform embodiments of the functions described below using special-purpose hardware.

At block 905, the method may include identifying a first cell plate included in a first cell plate group, as described with reference to FIGS. 1-8, among others. In some embodiments, this identification of the first cell plate may be based on one or more operating characteristics of the first cell plate, another cell plate, a combination of the first cell plate and a second cell plate, and/or one or more other separate cell plates. For example, the operating characteristics may include a voltage, a current, a value, an electric current relationship relating to one or more plates, a performance relationship relating to one or more plates, an absolute location of one or more plates and/or other components, a relative location of one or more plates and/or other components, some combination, and/or other characteristics and/or relationships In some embodiments, the operations of block 905 may be performed by the memory controller 140, as described with reference to FIGS. 1, 7, and 8, among others In some embodiments, the operations of block 905 may be initiated by the memory controller 140, as described with reference to FIGS. 1, 7, and 8, among others. In other embodiments, the operations of block 905 may be performed by a different element and/or component of a memory array and/or a memory apparatus other than memory controller 140.

At block 910, the method may include identifying a second cell plate that is adjacent to the first cell plate and/or included in the first cell plate group or a second cell plate group, as described with reference to FIGS. 1-8, among others. In some embodiments, this identification of the second cell plate may be based on one or more operating characteristics of the first cell plate, another cell plate, a combination of the first cell plate and a second cell plate, and/or one or more other separate cell plates, among other factors. For example, the operating characteristics may include a voltage, a current, a value, an electric current relationship relating to one or more plates, a performance relationship relating to one or more plates, an absolute location of one or more plates and/or other components, a relative location of one or more plates and/or other components, some combination, and/or other things. In some embodiments, the operations of block 910 may be performed by the memory controller 140, as described with reference to FIGS. 1, 7, and 8, among others. In some embodiments, the operations of block 910 may be initiated by the memory controller 140, as described with reference to FIGS. 1, 7, and 8, among others. In other embodiments, the operations of block 910 may be performed by a different element and/or component of a memory array and/or a memory apparatus, among other things.

At block 915, the method may include selecting the first cell plate and the second cell plate based on an electric current relationship between the first cell plate and the second cell plate, as described with reference to FIGS. 1-8, among others. This selection may be performed by and/or on one or more memory elements or components, and/or be based on electronic communication with one or more elements or components. In some embodiments, this selection may include selecting one or more selection components (that may in some embodiments include transistors, among other things). In some embodiments, this selection may include selecting one or more selection component pairs that may enable sense components corresponding to each digit line depending from each selection component to be correctly populated with data. In some embodiments, the method may further include reading from one or more sense components relating to one or more selection components, plates, and/or digit lines based on the selection.

In some embodiments, one or more selections may be based on one or more triggering events, including, but not limited to a fuse being triggered by one or more signals and/or one or more operating parameters relating to one or more elements or components (e.g., a cell plate and/or a sense component). In some embodiments, Based at least in part on the existence of and/or a determination of an electric current relationship In some embodiments, the operations of block 915 may be performed by the memory controller 140, as described with reference to FIGS. 1, 7, and 8, among others. In some embodiments, the operations of block 915 may be initiated by the memory controller 140, as described with reference to FIGS. 1, 7, and 8, among others. In other embodiments, the operations of block 915 may be performed by a different element and/or component of a memory array and/or a memory apparatus, among other things.

Figure 10:
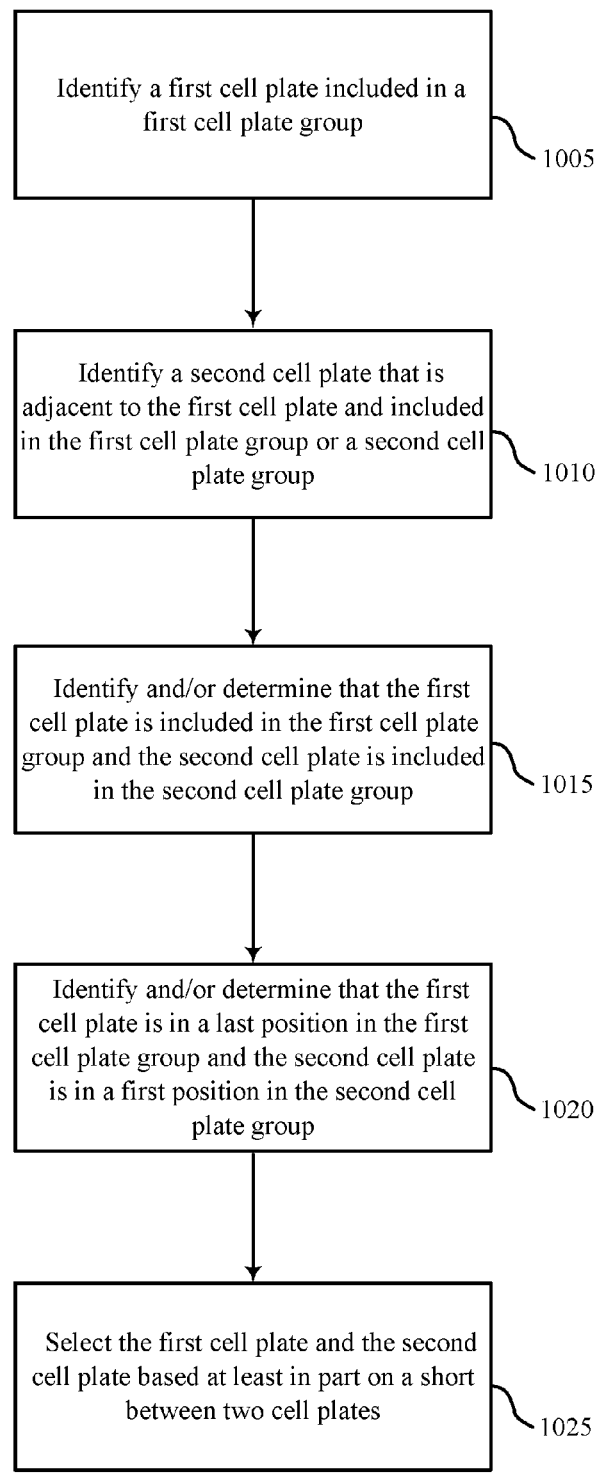

FIG. 10 shows a flowchart illustrating a method 1000 of selection of and operations relating to one or more cell plates in accordance with various embodiments of the present disclosure. The operations of methods and techniques discussed with reference to FIGS. 4-9, among others, may be implemented by a memory array 100 as described with reference to FIGS. 1-9. For example, the operations of method and techniques relating FIGS. 4-6, among others, may be performed by a memory controller 140 as described with reference to FIGS. 1, 7 and 8, among others. In some embodiments, a memory controller 140 may execute a set of codes to control the functional elements of the memory array 100 to perform the functions described below. Additionally or alternatively, the memory controller 140 may perform embodiments of the functions described below using special-purpose hardware. Additionally or alternatively, the memory controller 140 may initiate one or more signals and/or instruction to enable one or more other components or elements to perform embodiments of the functions described below using special-purpose hardware.

At block 1005, the method may include identifying a first cell plate included in a first cell plate group, as described with reference to FIGS. 1-9, among others. In some embodiments, this identification of the first cell plate may be based on one or more operating characteristics of the first cell plate, another cell plate, a combination of the first cell plate and a second cell plate, and/or one or more other separate cell plates. For example, the operating characteristics may include a voltage, a current, a value, an electric current relationship relating to one or more plates, a performance relationship relating to one or more plates, an absolute location of one or more plates and/or other components, a relative location of one or more plates and/or other components, some combination, and/or other things. In some embodiments, the operations of block 1005 may be performed by the memory controller 140, as described with reference to FIGS. 1, 7, and 8, among others. In some embodiments, the operations of block 1005 may be initiated by the memory controller 140, as described with reference to FIGS. 1, 7, and 8, among others. In other embodiments, the operations of block 1005 may be performed by a different element and/or component of a memory array and/or a memory apparatus, among other things.

At block 1010, the method may include identifying a second cell plate that is adjacent to the first cell plate and/or included in the first cell plate group or a second cell plate group, as described with reference to FIGS. 1-8, among others. In some embodiments, this identification of the second cell plate may be based on one or more operating characteristics of the first cell plate, another cell plate, a combination of the first cell plate and a second cell plate, and/or one or more other separate cell plates. For example, the operating characteristics may include a voltage, a current, a value, an electric current relationship relating to one or more plates, a performance relationship relating to one or more plates, an absolute location of one or more plates and/or other components, a relative location of one or more plates and/or other components, some combination, and/or other things.

In some embodiments, the identification of a second cell plate that is adjacent to the first cell plate may be made regardless of whether the second cell plate is included in a particular plate group (e.g., the first cell plate group, the second cell plate group). In some embodiments, the identification of a second cell plate that is adjacent to the first cell plate may be made based on whether the second cell plate is included in a particular plate group itself (e.g., the first cell plate group, the second cell plate group) and/or based on the whether another plate (e.g., a first cell plate) is included in the same plate group (irrespective of which particular plate group that is), a different plate group, a related plate group, an adjacent plate group, some combination, and/or other factors. In some embodiments, the operations of block 1010 may be performed by the memory controller 140, as described with reference to FIGS. 1, 7, and 8, among others. In some embodiments, the operations of block 1010 may be initiated by the memory controller 140, as described with reference to FIGS. 1, 7, and 8, among others. In other embodiments, the operations of block 1010 may be performed by a different element and/or component of a memory array and/or a memory apparatus, among other things.

At block 1015, the method may include identifying or determining that the first cell plate is included in the first cell plate group and the second cell plate is included in the second cell plate group, as described with reference to FIGS. 1-8, among others. This identification and/or determination may be performed by and/or on one or more memory elements or components, and/or be based on electronic communication with one or more elements or components. In some embodiments, this identification and/or determination may include identifying or determining a location and/or a spatial relationship between the first cell plate and the second cell plate. This identifying or determining of a location and/or a spatial relationship, among other things, may be based on determining or identifying whether the second cell plate is located in the same cell plate group as the first cell plate.

Additionally or alternatively, this identifying or determining of a location and/or a spatial relationship, among other things, may be based on determining whether the second cell plate is adjacent to the first cell plate in the first cell plate group. This identifying or determining of a location and/or a spatial relationship, among other things, may be based on determining or identifying whether the first cell plate and the second cell plate are located within absolute and/or relative respective positions within a first cell plate group and/or a second cell plate group. This identifying or determining of a location and/or a spatial relationship, among other things, may be based on determining or identifying whether the first cell plate and the second cell plate are located relative to a plate pair that is related to and/or includes an electric current relationship, which plate pair may or may not include the first cell plate and/or the second cell plate.

In some embodiments, the operations of block 1015 may be performed by the memory controller 140, as described with reference to FIGS. 1, 7, and 8, among others. In some embodiments, the operations of block 1015 may be initiated by the memory controller 140, as described with reference to FIGS. 1, 7, and 8, among others. In other embodiments, the operations of block 1015 may be performed by a different element and/or component of a memory array and/or a memory apparatus, among other things.

At block 1020, the method may include identifying or determining that the first cell plate is in a last position in the first cell plate group and the second cell plate is in a first position in the second cell plate group, as described with reference to FIGS. 1-8, among others. This identification and/or determination may be performed by and/or on one or more memory elements or components, and/or be based on electronic communication with one or more elements or components. In some embodiments, this identification and/or determination may include identifying or determining a location of each of and/or a spatial relationship between the first cell plate and the second cell plate. This identifying or determining of a location and/or a spatial relationship, among other things, may be based on determining or identifying whether the second cell plate is adjacent to (among other relationships) the first cell plate, but with each of these positioned in separate cell plate groups. This identifying or determining may be based on one or more other identifying, determining, and/or selecting steps, among other things.

This identifying or determining of a location and/or a spatial relationship, among other things, may be based on determining or identifying whether the first cell plate and the second cell plate are located within absolute and/or relative respective positions within a first cell plate group and/or a second cell plate group. For example, this identifying or determining may be based on determining whether the first cell plate is in a first position and/or an initial position (e.g., position "0") in the first cell plate group. This identifying or determining may be based on the identifying and/or the determining relating to the first cell plate and may be based on determining whether the second cell plate is in a first position and/or an initial position (e.g., position "0"), in an intermediate initial position (e.g., position "1" through position "6), and/or in a last and/or a final (e.g., position "7") in the second (or another) cell plate group. This identifying or determining of a location and/or a spatial relationship, among other things, may be based on determining or identifying whether the first cell plate and the second cell plate are located relative to a plate pair that is related to and/or includes an electric current relationship, In some embodiments, this plate pair may or may not include the first cell plate and/or the second cell plate.

In some embodiments, the operations of block 1020 may be performed by the memory controller 140, as described with reference to FIGS. 1, 7, and 8, among others. In some embodiments, the operations of block 1020 may be initiated by the memory controller 140, as described with reference to FIGS. 1, 7, and 8, among others. In other embodiments, the operations of block 1020 may be performed by a different element and/or component of a memory array and/or a memory apparatus, among other things.

At block 1025, the method may include selecting the first cell plate and the second cell plate based on a short between two cell plates, as described with reference to FIGS. 1-8, among others. This selection may be performed by and/or on one or more memory elements or components, and/or be based on electronic communication with one or more elements or components. In some embodiments, this selection may include selecting one or more selection components (that may in some embodiments include transistors, among other things). In some embodiments, this selection may include selecting one or more selection component pair that may enable sense components corresponding to each digit line depending from each selection component to be correctly populated with data. In some embodiments, the method may further include reading from one or more sense components relating to one or more selection components, plates, and/or digit lines based on the selection.

In some embodiments, one or more selections may be based on a triggering event, including, but not limited to a fuse being triggered by one or more signals and/or one or more operating parameters relating to one or more elements or components (e.g., a cell plate and/or a sense component). In some embodiments, based on the existence of and/or a determination of an adverse flow of electrons directly between two cell plates (e.g., a short). In some embodiments, the operations of block 1025 may be performed by the memory controller 140, as described with reference to FIGS. 1, 7, and 8, among others. In some embodiments, the operations of block 1025 may be initiated by the memory controller 140, as described with reference to FIGS. 1, 7, and 8, among others. In other embodiments, the operations of block 1025 may be performed by a different element and/or component of a memory array and/or a memory apparatus, among other things.

Thus, methods 900, 1000, and the others described throughout and contemplated by the present disclosure may provide for selection of and operations relating to cell plates using one or more elements or components. It should be noted that methods 900, 1000, and the others described throughout and contemplated by the present disclosure describe possible implementations, and the operations and steps may be rearranged, omitted, modified, supplemented, or otherwise modified such that other implementations are possible and contemplated. In some embodiments, embodiments from two or more of the methods 900, 1000, and the others described throughout and contemplated by the present disclosure may be combined.

The description herein provides embodiments, and is not limiting of the scope, applicability, or embodiments set forth in the claims. Changes may be made in the function and arrangement of elements discussed without departing from the scope of the disclosure. Various embodiments may omit, substitute, or add various procedures or components as appropriate. Also, features described with respect to some embodiments may be combined in other embodiments.

The description set forth herein, in connection with the appended drawings, describes example configurations and does not represent all the embodiments that may be implemented or that are within the scope of the claims. The terms "example" and "exemplary," as used herein, mean "serving as an example, instance, or illustration," and not "preferred" or "advantageous over other embodiments." The detailed description includes specific details for the purpose of providing an understanding of the described techniques. These techniques, however, may be practiced without these specific details. In some instances, well-known structures and devices are shown in block diagram form in order to avoid obscuring the concepts of the described embodiments.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components and/or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon, germanium, silicon-germanium alloy, gallium arsenide, gallium nitride, etc. In some embodiments, the substrate is a semiconductor wafer. In other embodiments, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other embodiments and implementations are within the scope of the disclosure and appended claims. For example, due to the nature of software, functions described above may be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that may be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the embodiments and designs described herein but is to be accorded the broadest scope consistent with the principles and novel features disclosed herein.

What is claimed is:

1. A method of operating a ferroelectric memory cell, comprising:
   identifying a first cell plate included in a first cell plate group comprising a plurality of sequential cell plates that are immediately adjacent;
   identifying a second cell plate that is adjacent to the first cell plate and included in a second cell plate group comprising a plurality of sequential cell plates that are immediately adjacent, wherein the first cell plate is in a last position in the first cell plate group and the second cell plate is in a first position in the second cell plate group; and
   selecting the first cell plate and the second cell plate based at least in part on a short between the first cell plate and the second cell plate.

2. The method of claim 1, wherein the short comprises:
   a first current level of the first cell plate and a second current level of the second cell plate, wherein the first current level results from applying a voltage to the first cell plate and the second current level results from applying the voltage to the second cell plate.

3. The method of claim 1, further comprising:
   reading information from the first cell plate and the second cell plate based at least in part on reading information from a first sense amp in electronic communication with the first cell plate and a second sense amp in electronic communication with the second cell plate.

4. The method of claim 1, further comprising:
   reading information from the first cell plate and the second cell plate in combination based at least in part on the selection.

5. A method of operating a ferroelectric memory cell, comprising:
   identifying a first cell plate included in a first cell plate group comprising a plurality of sequential cell plates that are immediately adjacent;
   identifying a second cell plate that is adjacent to the first cell plate and included in a second cell plate group comprising a plurality of sequential cell plates that are immediately adjacent;
   identifying a third cell plate included in a third cell plate group;
   identifying a fourth cell plate included in the second cell plate group or the third cell plate group;
   identifying the third cell plate adjacent to the fourth cell plate;
   selecting the first cell plate and the second cell plate based at least in part on a short between the first cell plate and the second cell plate, and
   selecting the third cell plate and the fourth cell plate as a pair based at least in part on the short between the first cell plate and the second cell plate.

6. The method of claim 5, wherein the third cell plate is included in the third cell plate group and the fourth cell plate is included in the second cell plate group.

7. The method of claim 6, wherein the third cell plate is in a first position in the third cell plate group and the fourth cell plate is in a last position in the second cell plate group.

8. An electronic memory apparatus, comprising:
   a first cell plate group comprising a plurality of sequential cell plates that are immediately adjacent;
   a second cell plate group comprising a plurality of sequential cell plates that are immediately adjacent;
   a first cell plate included in the first cell plate group; and
   a second cell plate adjacent to the first cell plate and included in the second cell plate group, wherein the first cell plate and the second cell plate are in electronic communication via a short between the first cell plate and the second cell plate, wherein the first cell plate is in a last position in the first cell plate group and the second cell plate is in a first position in the second cell plate group.

9. The electronic memory apparatus of claim 8, wherein the electronic communication is based at least in part on a proximity of the first cell plate to the second cell plate.

10. The electronic memory apparatus of claim 8, further comprising:
    a first digit line in electronic communication with the first cell plate and a first sense amp via a first transistor.

11. The electronic memory apparatus of claim 10, further comprising:
    a second digit line in electronic communication with the second cell plate and a second sense amp via a second transistor.

12. An electronic memory apparatus, comprising:
    a first cell plate included in a first cell plate group comprising a plurality of sequential cell plates that are immediately adjacent;
    a second cell plate included in a second cell plate group comprising a plurality of sequential cell plates that are immediately adjacent, wherein the first cell plate is in a last position in the first cell plate group and the second cell plate is in a first position in the second cell plate group;
    a first digit line in electronic communication with the first cell plate and a first sense amp via a first transistor;
    a second digit line in electronic communication with the second cell plate and a second sense amp via a second transistor; and
    a controller in electronic communication with the first sense amp and the second sense amp, wherein the controller is operable to:
        select the first cell plate and the second cell plate based at least in part on a short between the first cell plate and the second cell plate; and
        read information from at least one of the first sense amp and the second sense amp based at least in part on the selection.

13. The electronic memory apparatus of claim 12, wherein the first cell plate group is adjacent to the second cell plate group.

14. The electronic memory apparatus of claim 12, wherein the controller is operable to:
    select the first cell plate from the first cell plate group and the second cell plate from the second cell plate group.

15. The electronic memory apparatus of claim 12, wherein the short is based at least in part on a position of the first cell plate in the first cell plate group relative to the second cell plate in the second cell plate group.

16. An electronic memory apparatus, comprising:
    a first cell plate included in a first cell plate group comprising a plurality of sequential cell plates that are immediately adjacent;
    a second cell plate included in a second cell plate group comprising a plurality of sequential cell plates that are immediately adjacent;
    a first digit line in electronic communication with the first cell plate and a first sense amp via a first transistor;
    a second digit line in electronic communication with the second cell plate and a second sense amp via a second transistor;
    a third cell plate included in the first cell plate group;
    a fourth cell plate included in the first cell plate group; and
    a controller in electronic communication with the first sense amp and the second sense amp, wherein the controller is operable to:
        select the first cell plate and the second cell plate based at least in part on a short between the first cell plate and the second cell plate;
        select the third cell plate and the fourth cell plate based at least in part on a spatial relationship between the first cell plate and the second cell plate; and
        read information from at least one of the first sense amp and the second sense amp based at least in part on the selection.

17. The electronic memory apparatus of claim 16, wherein the third cell plate is adjacent to the first cell plate and the fourth cell plate.

* * * * *